US010284925B2

(12) United States Patent
Donaghey et al.

(10) Patent No.: US 10,284,925 B2
(45) Date of Patent: *May 7, 2019

(54) METER DEVICE

(71) Applicant: Freestyle Technology Pty Ltd, Mount Waverley, Victoria (AU)

(72) Inventors: Andrew Paul Donaghey, Vermont South (AU); Ian Kenneth Francis McDonald, Huntingdale (AU); David Lewis Beard, Warranwood (AU)

(73) Assignee: Freestyle Technology Limited, Victoria (AU)

( * ) Notice: Subject to any disclaimer, the term of this patent is extended or adjusted under 35 U.S.C. 154(b) by 0 days.

This patent is subject to a terminal disclaimer.

(21) Appl. No.: 15/631,817

(22) Filed: Jun. 23, 2017

(65) Prior Publication Data

US 2017/0311054 A1   Oct. 26, 2017

Related U.S. Application Data

(63) Continuation of application No. 11/571,204, filed as application No. PCT/AU2005/000917 on Jun. 24, 2005, now Pat. No. 9,726,515.

(Continued)

(30) Foreign Application Priority Data

Jun. 24, 2004  (AU) ................................ 2004903457
Sep. 13, 2004  (AU) ................................ 2004905262

(51) Int. Cl.
*H04Q 9/00*   (2006.01)
*G06F 8/654*  (2018.01)
(Continued)

(52) U.S. Cl.
CPC ............... *H04Q 9/00* (2013.01); *G01D 4/004* (2013.01); *G06F 8/654* (2018.02); *G08G 1/092* (2013.01);
(Continued)

(58) Field of Classification Search
CPC ....................................................... G01D 4/004
See application file for complete search history.

(56) References Cited

U.S. PATENT DOCUMENTS 4,701,698  A   10/1987  Karlsson et al.
5,155,614  A   10/1992  Carmen et al.
(Continued)

FOREIGN PATENT DOCUMENTS

EP   0860648   8/1998
EP   0877257   11/1998
(Continued)

OTHER PUBLICATIONS

Australian Office Action; 2010246406; dated Aug. 22, 2011.
(Continued)

*Primary Examiner* — Amine Benlagsir
(74) *Attorney, Agent, or Firm* — Fish & Richardson P.C.

(57) ABSTRACT

A utility meter device (1002) including a communications receiver (110) for receiving file fragments for the device, a processing means (150), eg microprocessor, microcontroller, and programmable non-volatile memory means (120), eg flash, EEPROM, for building and storing application and data files from the fragments, and executing a meter application of the device by processing at least one application file and associated data identified by configuration instructions in at least one of the fragments to provide data for reconfiguring a meter through a control interface (1016).

13 Claims, 25 Drawing Sheets

Related U.S. Application Data

(60) Provisional application No. 60/608,379, filed on Sep. 10, 2004.

(51) Int. Cl.

| | | |
|---|---|---|
| *G01D 4/00* | (2006.01) | |
| *G08G 1/09* | (2006.01) | |
| *G08G 1/0962* | (2006.01) | |
| *G08G 5/00* | (2006.01) | |
| G01R 22/06 | (2006.01) | |
| G01R 22/10 | (2006.01) | |

(52) U.S. Cl.
CPC ......... *G08G 1/0962* (2013.01); *G08G 5/0026* (2013.01); *G01R 22/063* (2013.01); *G01R 22/10* (2013.01); *G08G 1/091* (2013.01); *Y02B 90/242* (2013.01); *Y04S 20/322* (2013.01)

(56) References Cited

U.S. PATENT DOCUMENTS

| | | | |
|---|---|---|---|
| 5,467,286 | A | 11/1995 | Pyle et al. |
| 5,666,293 | A | 9/1997 | Metz et al. |
| 5,862,203 | A | 1/1999 | Wulkan et al. |
| 5,892,758 | A | 4/1999 | Argyroudis |
| 6,169,791 | B1 | 1/2001 | Pokress |
| 6,240,169 | B1 | 5/2001 | Haskins et al. |
| 6,381,465 | B1 | 4/2002 | Chen et al. |
| 6,512,463 | B1 | 1/2003 | Campbell et al. |
| 6,526,335 | B1 | 2/2003 | Treyz et al. |
| 6,741,188 | B1 | 5/2004 | Miller et al. |
| 6,993,326 | B2 | 1/2006 | Link et al. |
| 2001/0039537 | A1 | 11/2001 | Carpenter et al. |
| 2002/0015442 | A1 | 2/2002 | Takeuchi et al. |
| 2002/0022920 | A1 | 2/2002 | Straub |
| 2002/0059498 | A1 | 5/2002 | Ng et al. |
| 2002/0069263 | A1 | 6/2002 | Sears et al. |
| 2002/0078209 | A1 | 6/2002 | Peng |
| 2002/0120874 | A1 | 8/2002 | Shu et al. |
| 2002/0181415 | A1 | 12/2002 | West et al. |
| 2003/0022663 | A1 | 1/2003 | Rajaram et al. |
| 2003/0061604 | A1 | 3/2003 | Elcock et al. |
| 2003/0169181 | A1 | 9/2003 | Taylor et al. |
| 2003/0188153 | A1 * | 10/2003 | Demoff ............... G06F 11/2069 713/153 |
| 2004/0034484 | A1 | 2/2004 | Solomita, Jr. et al. |
| 2004/0038671 | A1 | 2/2004 | Trayford et al. |
| 2004/0067752 | A1 | 4/2004 | Himmelstein |
| 2004/0068364 | A1 | 4/2004 | Zhao et al. |
| 2004/0098715 | A1 | 5/2004 | Aghera et al. |
| 2004/0104842 | A1 | 6/2004 | Drury et al. |
| 2004/0107025 | A1 | 6/2004 | Ransom et al. |
| 2004/0233930 | A1 | 11/2004 | Colby |
| 2005/0086328 | A1 | 4/2005 | Landram et al. |
| 2005/0122977 | A1 | 6/2005 | Lieberman |
| 2005/0135423 | A1 | 6/2005 | Chen |
| 2006/0048141 | A1 | 3/2006 | Persson et al. |
| 2007/0067581 | A1 | 3/2007 | Baek |
| 2009/0055032 | A1 | 2/2009 | Rodgers |
| 2009/0319853 | A1 | 12/2009 | Keyghobad et al. |

FOREIGN PATENT DOCUMENTS

| | | | |
|---|---|---|---|
| EP | 0979016 | 2/2000 | |
| NZ | 520872 | 12/2003 | |
| WO | WO 1997/29466 | 8/1997 | |
| WO | WO 1999/58987 | 11/1999 | |
| WO | WO 2001/01154 | 1/2001 | |
| WO | WO 2003/025742 | 3/2003 | |
| WO | WO 03027840 A1 * | 4/2003 | ............. G01D 4/004 |
| WO | WO 2003/036933 | 5/2003 | |
| WO | WO 2003/055031 | 7/2003 | |
| WO | WO 2004/073332 | 8/2004 | |

OTHER PUBLICATIONS

Canadian Office Action; CA 2,571,330; dated Sep. 9, 2015; 6 pp.
International Search Report; PCT/AU2005/000917; dated Jul. 22, 2005; S. Kaul.
International Search Report; PCT/AU2005/000923; dated Sep. 1, 2005; M. Hollingworth.
International Search Report; PCT/AU2005/000922; dated Oct. 13, 2005; M. Hollingworth.
Supplementary Partial European Search Report, EP05754318, dated May 7, 2012, 4 pages.

* cited by examiner

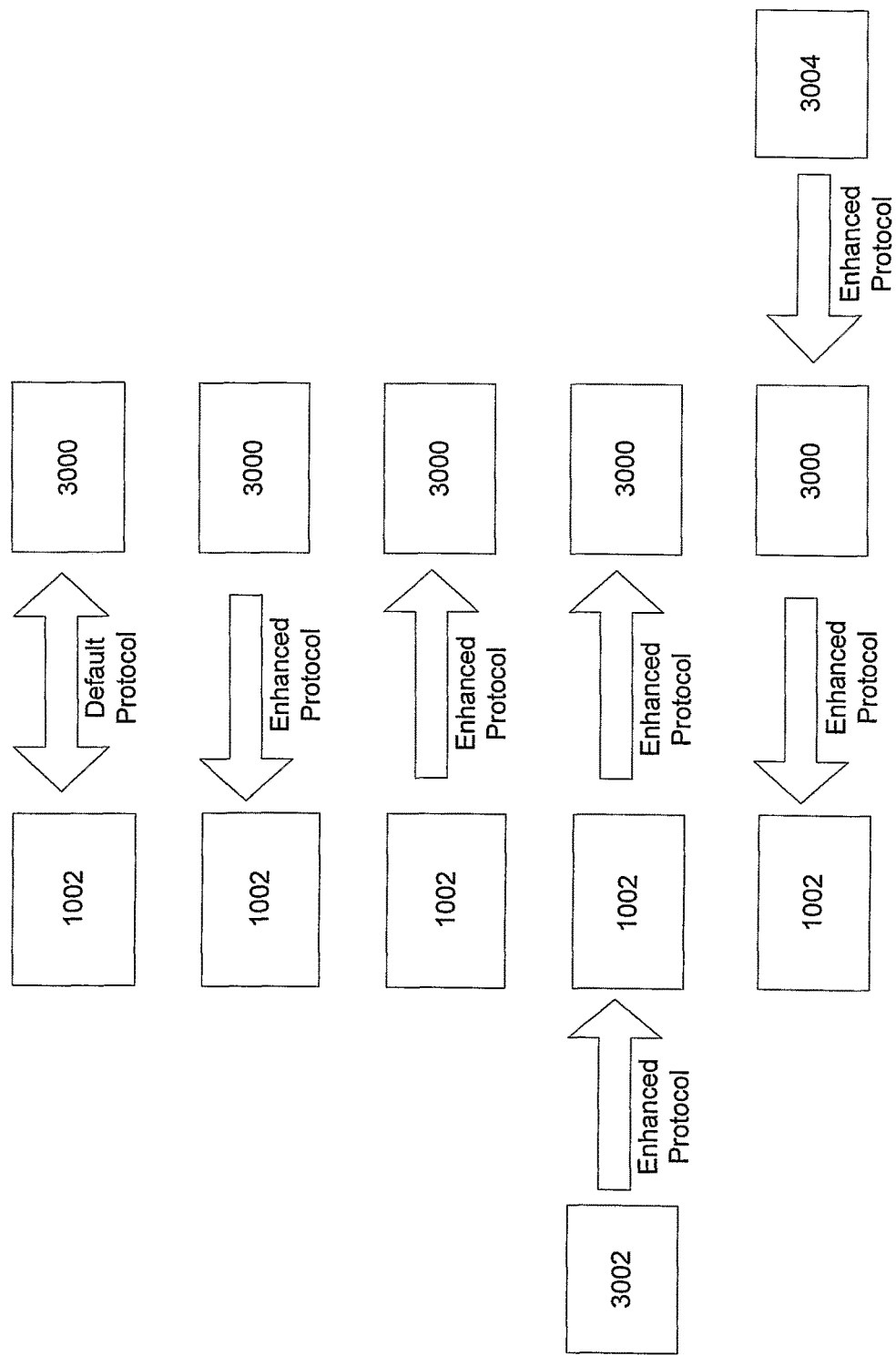

METER DEVICE

CROSS REFERENCE TO RELATED APPLICATIONS

This application is a continuation of and claims priority to U.S. application Ser. No. 11/571,204, filed on Mar. 23, 2017, which is a 371 of International Patent Application No. PCT/AU2005/000917, filed on Jun. 24, 2005, which claims priority to Australian Application No. 2004903457, filed on Jun. 24, 2004 and Australian Application No. 2004905262, filed on Sep. 13, 2004, and which also claims priority from U.S. Provisional Application No. 60/608,379, filed on Sep. 10, 2004. The above applications are incorporated herein by reference in their entirety.

TECHNICAL FIELD

The present invention relates to a meter device that is able to remotely receive application, configuration or data files to establish, adjust or control the application executed by the device.

BACKGROUND

Consumer electronic devices are now commonly used for a wide variety of applications. Many of the devices now include an embedded processor architecture, which normally comprises a microprocessor and associated memory. Instructional code and data for the device is stored in the architecture and defines and controls the application for which the device has been specifically built. For example, a compact disc (CD) player and a cordless telephone each include a basic processor architecture, but the similarities then normally cease as the CD player is specifically configured to perform a number of tasks associated with processing the audio data on a CD, whereas a telephone is specifically configured to perform a number of call handling tasks. Similar considerations apply to other electronic devices, such as video game consoles, mobile telephones, electronic toys, cameras, etc. The device is specifically configured for its chosen application, and that application cannot be changed, particularly by the receipt of any remote instructions. Even more general processing devices, such as a wireless personal digital assistant (PDA) or a personal computer connected to a computer network, have defined operating systems with a defined set of APIs that restrict the applications that can be performed on the devices, and restrict the extent to which the devices are remotely configurable. Restrictions are also imposed by the security constraints associated with the network that can be used to connect to the device, and any configuration is performed on a one to one basis, ie only one client device can be configured remotely at a given time.

Meters installed at dwellings, such as households or business premises, suffer similar restrictions. The meters are used to measure volume, flow rate, and/or time, and the values obtained are used to derive additional data (such as unit consumption and peak usage information) for billing a customer for products/services provided by a supplier on a metered basis. Meters are generally limited to a specific set of functions that are installed into the meters at the time of manufacture. More sophisticated meters have the ability to enable or disable functional options as required (e.g. on demand) to meet the requirements of the supplier and/or customer (e.g. for collecting a customer's usage data). Generally, the functionality of a meter cannot changed after it has been manufactured, as the functions installed in the meters at the time of manufacture are expected to support all eventualities required over the life of these meters. However, the metering requirements of suppliers and/or customers may change over time. For example, a supplier may change of way of measuring and/or controlling their customers' consumption of a product or service that are provided on a metered basis (e.g. the ceasing and resumption of services conditional on payment or time). Furthermore, customers may have changing requirements or expectations that change over time, such as the ability to control the volume of consumption.

It is impractical to manufacture and install a new meter every time new functionality is required. Furthermore, the repair or installation of new components to an existing meter at its location is often complicated, and requires the specialist skills for installation.

It is desired to address the above or at least provide a useful alternative.

SUMMARY

In accordance with the present invention there is provided a meter device including: a communications receiver for receiving file fragments for said device; a microcontroller system including a microcontroller and a programmable nonvolatile memory system, for building and storing application and data files from said fragments, and executing a meter application of said device by processing at least one application file and associated data identified by configuration instructions included in at least one of said fragments to provide data for reconfiguring a meter.

The present invention also provides a meter device, including: a wireless communications receiver for receiving files for said device; a microcontroller system for processing and storing said files, and performing a meter application defined by said files to configure a meter installed at a dwelling.

The present invention also provides a meter device, including: a microprocessor; a programmable non-volatile memory system addressable by the microprocessor; a communications receiver for receiving file fragments for said device; and an operating system (OS) for controlling the device to identify fragments for said device, build files from said fragments, store said files in said memory system, and process the files as defining a meter application for providing meter data for a meter.

DESCRIPTION OF DRAWINGS

Preferred embodiments of the present invention are hereinafter described, by way of example only, with reference to the accompanying drawings, wherein:

FIG. 32 is a flow diagram of the enhancement of a default interface and/or protocol for a client device from multiple sources.

DETAILED DESCRIPTION

1. The Client Processor Device

Figure 1:
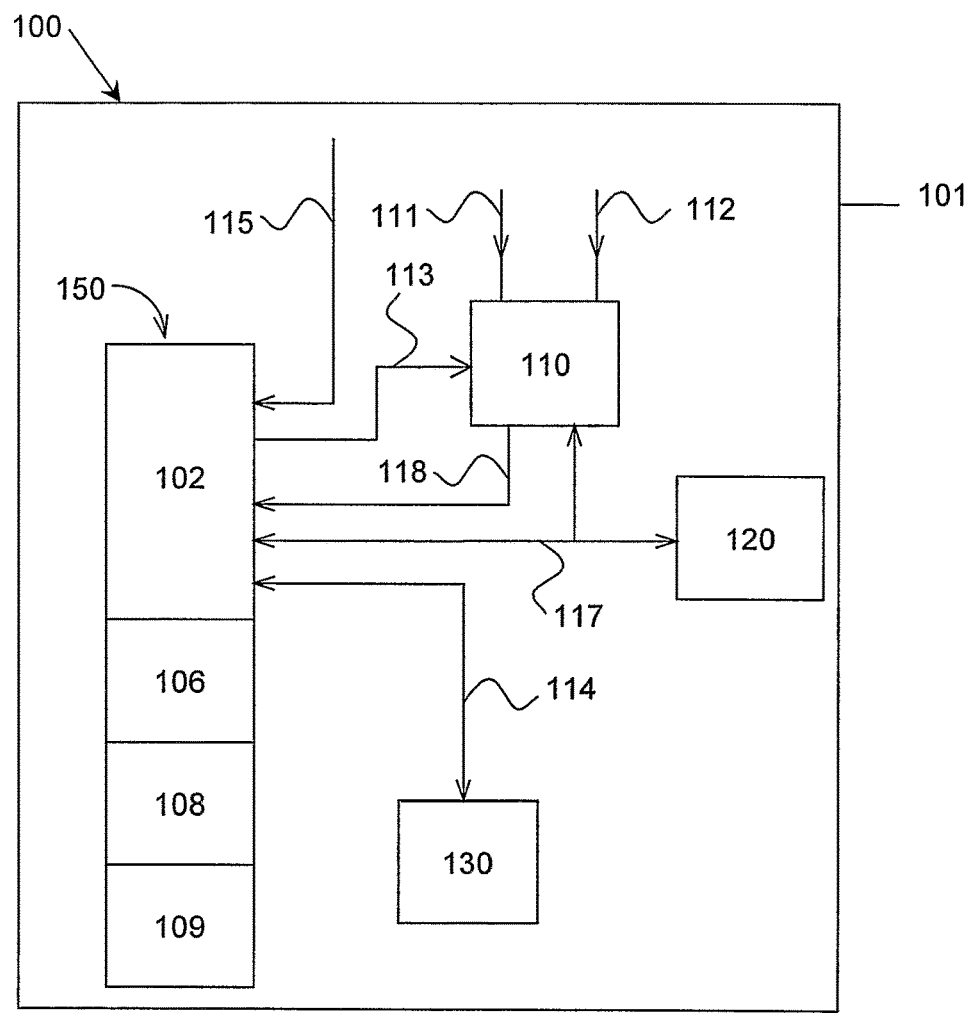
FIG. 1 is a block diagram of a preferred embodiment of a client processor device.

A client processor device 100, as shown in FIG. 1, has a housing 101 that contains a printed circuit board on which three semiconductor chips 110, 120 and 150 are mounted to provide a receiver 110, a non-volatile programmable memory 120, in the form of data-flash memory, and a microcontroller 150. Other support components for the chips are included on the board within the housing 101, such as a battery power system, and any additional input/output (I/O) components 130 that are required, such as a LED or LCD display and control input buttons or keys. The microcontroller 150 is connected to the receiver 110 and the memory 120 via a serial interface 117 and to an address and data bus 114 for connection to the I/O components 130, and has an asynchronous serial interface 115 for external peripherals. The housing 101 is relatively small, and the footprint of the device 100 occupies less than 20 cm$^2$. The electronic components of the device 100 also consume less than 100 mW.

The microcontroller 150 is an 8-bit microcontroller with flash read only memory (ROM) 106 (about 128 kbytes), electronically erasable and programmable read only memory (EEPROM) 109 and random access memory (RAM) 108 (less than 4 kbytes), such as the PIC 18I Series Microcontrollers produced by Microchip Technology Inc (http//www.microchip.com). The processor core 102 of the microcontroller 150 has a hardware return stack of 32 levels, and no formal data stack, making it primarily suitable to handling only one processor task. Offset addressing is not supported and only two hardware interrupts are provided, one low and one high priority interrupt, without any support for software interrupts. The return stack stores a return address only.

The memory 120 provides data storage on a data flash device, such as the AT45 Series of data-flash memories produced by Atmel Inc (http://www.atmel.com), using a hierarchal structure of sectors, blocks and pages as discussed in detail below. A complete page, comprising 264 or more bytes depending on device type, is written at once, whereas at least one block is erased, with a block comprising eight pages of data. The data-flash memory 120 is managed by a flash file system, described in detail below.

The receiver 110 is an RF transceiver, such as the NT29xx series produced by Numa Technologies, Inc (http://www.numatechnologies.com), and is controlled by the microcontroller 150 (via the serial interface 117) to provide an analog output 118, for sampling by the processor core 102, of the radio frequency (RF) signal received by the receiver 110. The receiver provides an air interface, and is frequency agile being phase locked loop synthesised. The receiver uses diversity antennas 111 and 112 connected to the transceiver chip 110, under control of the processor 150 using a control signal 113 to switch the signal from one or the other antenna, to improve performance under marginal signal conditions. A switching arrangement is used, but it is also possible to use dual receivers and receive paths, which may be tuned to different frequencies.

Figure 2:
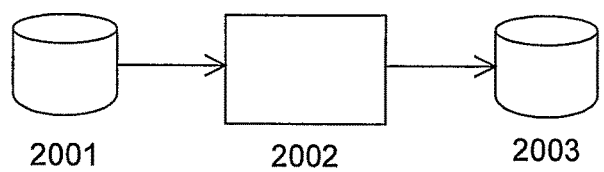
FIG. 2 is a block diagram of compilation components for firmware of the client processor device.

The firmware production process is shown in FIG. 2. The firmware 2003 stored in the ROM 106 of the device 100 is primarily written as source code 2001 in the C programming language and compiled using the PICC-18 ANSI C compiler 2002 provided by HI-TECH Software LLC. The compiler uses a compiled stack to deal with the omitted data stack from the processor core 102. The data stack would normally hold auto-allocated (local) variables and function parameters. Instead, the complete calling hierarchy of the code is evaluated at compile time by the compiler to produce a call-graph tree, as described below. The auto-allocated variables and function parameters are allocated to a fixed memory bank in a section of the RAM 108, being designated parameter RAM by the compiler, and the allocations are shared where possible to minimise the overall parameter RAM requirements. For example, the maximum possible parameter RAM size may be 256 bytes, a compromise between the bank switching limitations of the processor and the speed and size of the code. This maximum allocation size is normally more than sufficient for a single main task and routines called using the low and high priority interrupt handlers. The compiled stack is only designed to handle a single task without supporting re-entrant code. The compiler defines three separate roots in a call graph, one for main execution and one for each of the interrupts.

Figure 3:
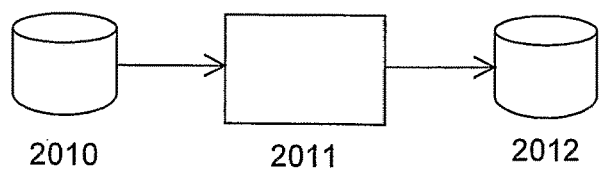
FIG. 3 is a block diagram of compilation components for an application of the client processor device.

The application production process is shown in FIG. 3. An application 2012 sent to and stored in the flash memory 106 of the device 100 is primarily written as source code 2010 in a programming language, such as C, and compiled into byte code for a virtual machine (VM) using a compiler 2011 for the device 100.

Operating System (OS)

Figure 5:
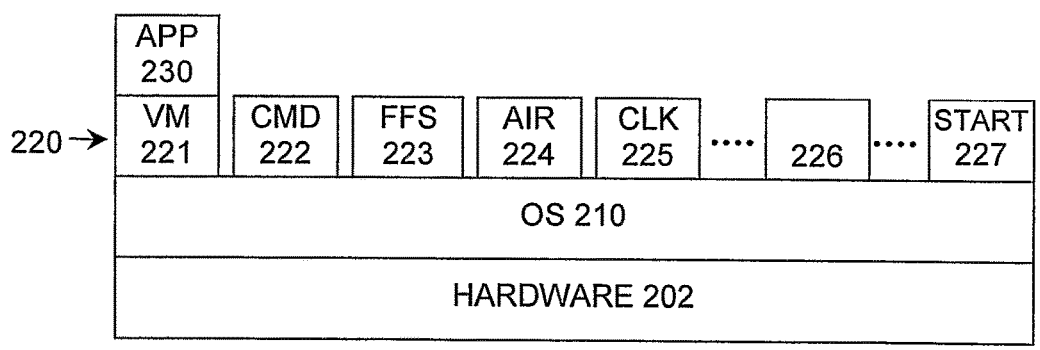
FIG. 5 is a block diagram of the logic architecture of the client processor device.

The operating system (OS) 210 can be considered to reside on and be supported by the hardware 202 of the device 100, as shown in FIG. 5. The code for the OS and its basic tasks 220 are stored in the flash ROM 106. The OS on boot, sets the interrupts, initialises semaphores (described below) and scheduling, and supports and runs a start-up task 227 which in turn starts the remaining basic tasks 220, including the virtual machine task 221 on which the application code 230 relies. The number of tasks is limited to eight due to the word length of one byte of the processor 102 and because an increase would substantially increase overhead. The OS provides a cooperative multi-tasking environment to allow asynchronous events to be handled independently, with much reduced code complexity, enabling the device 100 to be more responsive and reliable. The asynchronous events are normally those either caused externally to, or not under control of, the device, such as button presses, characters received on a serial port interface of the I/O 130 or a hardware peripheral connected to the I/O 130 completing an operation. Most of the events require a response in a timely manner.

The operating system is able to share the time of the processor 102 between the tasks by rapidly context switching between them on a cooperative basis. The tasks are:
(i) A clock task 225. This maintains time of day and a calendar,
(ii) A virtual machine (VM) task 221. This processes the byte code of the application files as discussed below.
(iii) A command task 222. This establishes a set of commands available via the local asynchronous serial interface 115.
(iv) A flash file system task 223. This handles building and management of all files within the flash memory 120.
(v) An air task 224. This establishes communications and control of the transceiver 110 and supports an air protocol of the device 100, as discussed below.
(vi) Additional tasks 226. This represents any other tasks as required, for example, to process data received from a global positioning system (GPS) receiver,
(vii) The start-up task 227. This establishes the remaining tasks in a controlled fashion as discussed below.

The tasks are each assigned a unique priority depending upon the required processing rate and latency, when started. When a context switch is performed, the OS moves the processor stack contents to a memory area allocated for the task being swapped out, and then restores it with the stored stack for the new task to be run. By allocating stack memory levels required for each task, memory requirements are contained. The storage level can be allocated from 2 to 32 depending on the task, when it is started. A context switch may involve calling a function (e.g. the OS_YieldQ function) in the OS, which causes the running task to yield control to the OS and therefore allowing another task to run. Preferably, context switching is achieved only by calling the OS_YieldQ function. A common scratch-pad area of the RAM 108 is used for temporary processing and is only relevant within a function call, as the contents are ignored if another routine is called, which may overwrite the contents. Accordingly, when the OS accomplishes a task switch, the scratch pad area does not need to be saved thereby providing a significant saving of RAM and processor overhead.

Many software modules and hardware resources (e.g. the data-flash memory 120, the EEPROM 109, and the bus 117) need to be shared between tasks, and each shared resource is allocated a binary semaphore (or token). If a resource is used and another task attempts to use it, then this is prohibited until the first task finishes with the resource. Locking of the shared resources protects them from re-entrant calls. In the device 100, normally 20 to 30 semaphores are allocated to lock the resources. Binary semaphores are controlled as a bit field in bit addressable memory of the RAM 108, and counting semaphores are used to control linear or multi-level resources (such as buffers). The semaphores are allocated when the firmware 2003 is compiled by the compiler 2002.

To protect the shared code (and resource) via locking, the following procedure is used:
(a) Request access to the module/resource via the semaphore.
(b) Lock out other tasks using the semaphore associated with the module/resource once access is obtained;
(c) Call functions for the module/resource; and
(d) Allow other tasks access by freeing the semaphore associated with the module/resource.

These steps (a) and (d) may be implemented as functions in the corresponding software modules to save code space (e.g. as Lock and Unlock functions).

Task re-entrant code can be written to allow multiple tasks to call the same routine. A particular task may only call the one routine once. To do this the routine's parameters are saved if they must be accessed after the context switch. This can be achieved using an array to provide context sensitive storage for each task as follows:

```
char storage[8]; // Parameter storage for each of 8 tasks
void shared(char var) {
    storage [<current_task>] = var; // save the parameter
    OS_Yield( ); // context switch
    var = storage [<current_task>] ; // Restore parameter...
}
```

The OS also includes a scheduler that is responsible for determining the processor time allocated to each task. The highest priority task (e.g. task "1") is allocated up to 50% of the processor time, given the opportunity to run every second context switch, whilst the next high office priority task (e.g. task "2") is allowed to run 25% percent of the context switches and so on. For example, the task may be switched based on a priority level as follows: 1 2 1 3 1 2 1 4 1 2 1 3 1 2 1 5, etc. If a task cannot be run because it is blocked, then the next lowest priority task is run and so on. This allows resource intensive or critical tasks to be run more often or with lower latency whilst ensuring slower tasks are not able to stall. The scheduler in addition is able to prevent a potential priority inversion hang without requiring a complex priority inheritance procedure. While lower priority tasks are guaranteed to run, a higher priority task waiting on a resource in use by a lower level task will not be indefinitely blocked.

The low and high priority interrupts of the processor 100 are treated as being slow and fast, respectively. The fast interrupt is reserved for handling time critical tasks, such as analog to digital conversion of a sampled analog signal. The fast interrupts generally do not relate to the use of shared routines or those of the OS, and the slow interrupts are used to handle asynchronous events, such as timer interrupts, serial port events and lower level packet decoding that directly relate to OS controlled tasks. The low interrupt handlers use OS functions, such as semaphores to communicate with tasks.

Figure 6:
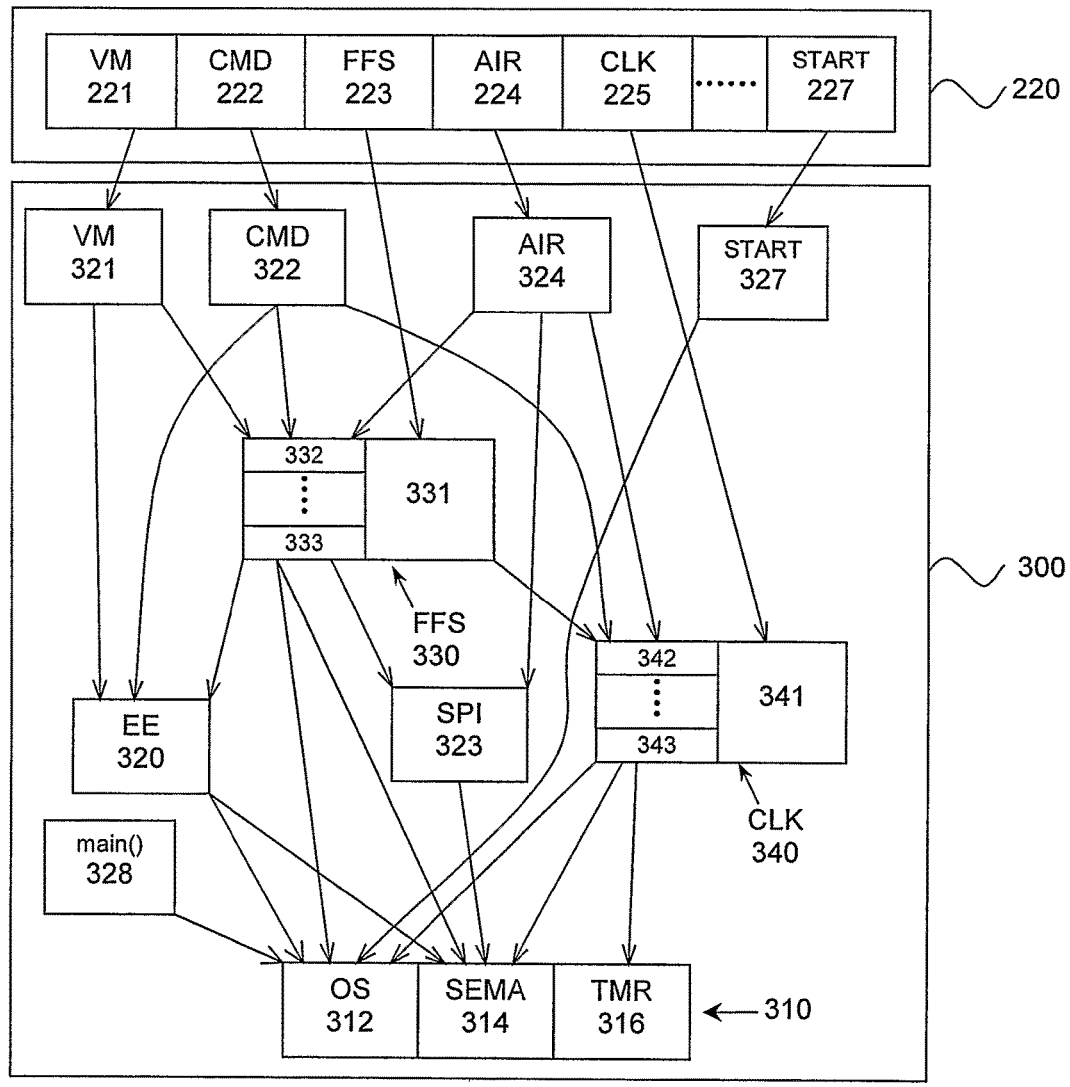
FIG. 6 is a block diagram of the software architecture of the client processor device.

A timer module 316 of the OS provides, shown in FIG. 6, accurate timing of intervals and delays, and allows tasks to be synchronised to a period such as one second for a clock of the device 100. The timer module allows a variety of different high and low resolution durations to be measured, and a number of timers, can be allocated when the firmware is compiled.

Software Architecture

The software architecture employed by the firmware stored in the ROM 106 distinguishes between software modules 300 and the tasks 220, as shown in FIG. 6. The software modules 300 are available for use by the tasks 220, the arrows indicating dependencies. An object-oriented approach is used in the module decomposition process, and some modules are given responsibility at a given time for a particular shared resource (e.g. the serial interface, EEPROM, etc.) as required.

There are four classes of software modules 300. The first type 310 includes the OS core 312 that manages scheduling and task switching, and the semaphore 314 and timing 316 modules. These modules are typically used by all tasks and written to guarantee that they can be called at any time (i.e. not require locking). The second type are shared modules that must be locked to ensure conflicts do not occur. These include an SPI module 323 that manages data transfer on the serial peripheral interface and an EE module 320 that allows access to the processor's EEPROM 109. These modules typically contain a number of available routines, which are locked as a group (i.e. these routines are locked/unlocked using the same semaphore).

The third type are modules run autonomously from a task. These include the virtual machine 321, command processor 322, air interface 324 and start-up 327 modules. These are each dedicated to a particular task, not shared and therefore do not require locking.

The fourth type is a combination of the latter two. These have components that are run only from a single task, for example in the flash file system (FFS) module 330, the module 331 is run from a FFS task 223 whereas a set of shared functions, 332 and 333 are available for use by external modules, including the internal component 331. The shared functions are locked for use. The clock module 340 is another example, where a dedicated module 341 is run from the clock task 225, and a set of shared functions 342, 343 are also available for use by other modules.

The main( ) routine 328 is responsible for initialising all modules as required and calling an OS 312 routine to run the start-up task 227.

Call Graph Management

Manipulation of the call graph supports a multi-tasking environment. Call-graph allocation is performed using assembler directives unique to the firmware compiler 2002. These include directives to define a root, and to allocate each routine to a particular root. Any of the modules that have contained routines that run to completion and do not require a separate call-graph root are defined to use a default main root to save parameter space.

A flattening call-graph approach could be used but typically results in the very limited parameter space allocation being easily exceeded. Rather, the call graph is broken into a number of separate trees, whereby the main function of each task forms the base of a tree or root. This allows the overlaying of auto variables between functions and parameter passing. For routines that are not run to completion, assembly directives in the task code are used. These are used internally by the compiler to ensure interrupt code starts at a separate base and interrupts can run at any time. Routines or functions that are shared across tasks are always assigned to a root. Shared functions which always run to completion between context switches may all share the same root as they will not run concurrently, but they may not share a root with tasks that do not always run to completion. Any shared functions that may incur a context switch before they complete are assigned a unique root. Groups of such functions or routines that are guaranteed never to be called concurrently by more than one task can be assigned the same root to conserve parameter space.

Any functions solely called either directly or indirectly by the main( ) routine 328 need not be formally placed in the call-graph as they will be placed in the main root of the call-graph by the compiler. These would typically include once-off initialisation and configuration functions.

Firmware Management

Figure 4:
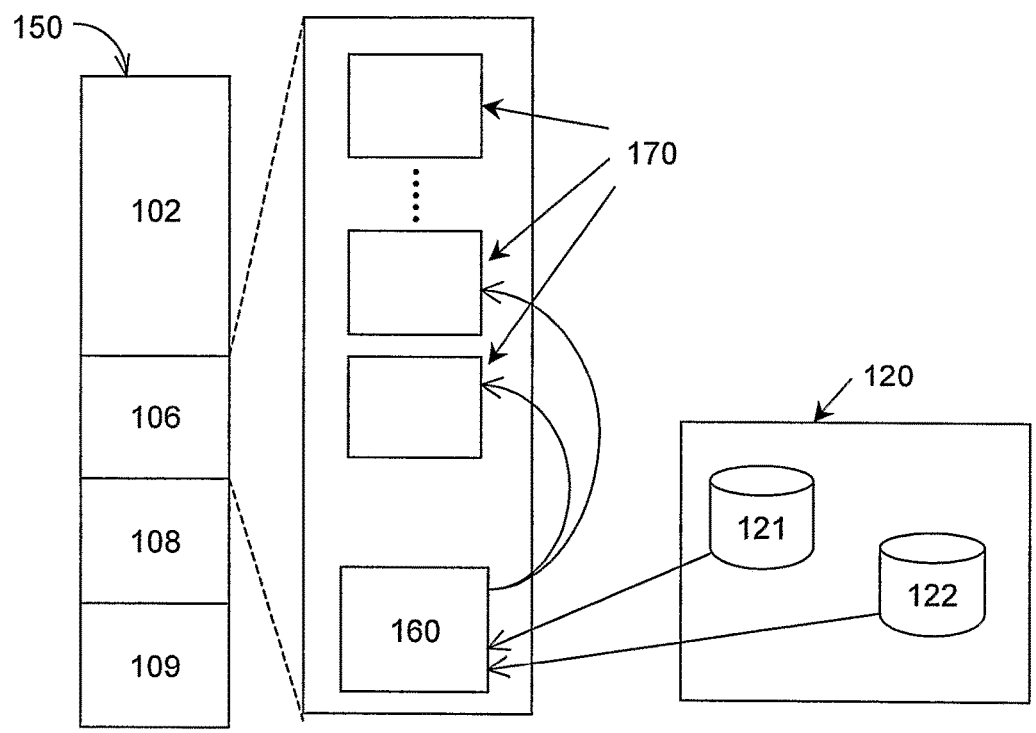
FIG. 4 is a block diagram of firmware management components for the client processor device.

The device 100 can be structured so that only a small boot routine 160 is permanently held in the device ROM 106 as depicted in FIG. 4. The boot routine 160 can program the remaining firmware components 170 into the ROM with data obtained via the local interface 115, or transfer execution to the remaining firmware components once they are programmed.

Once the remaining firmware components are in place and operating, the flash file system of the client processor device 100 receives and stores files in the flash memory 120 for processing by the virtual machine 321 of the OS. The files normally relate to an application or a version of the application, but the files may also include updates to the remaining firmware components. The boot routine 160 may read file information from the flash memory 120 but without the need to implement the flash file system to the full extent. The boot routine may compare the versions of the firmware components programmed in the device ROM with files identified to be firmware (e.g 121, 122) in the flash memory 120 and automatically update the firmware components in the device ROM, if it determines they are newer.

The device 100 is entirely remotely configurable, without a user having to interact directly with the device, e.g. by selecting a button.

Flash File System

Figure 7:
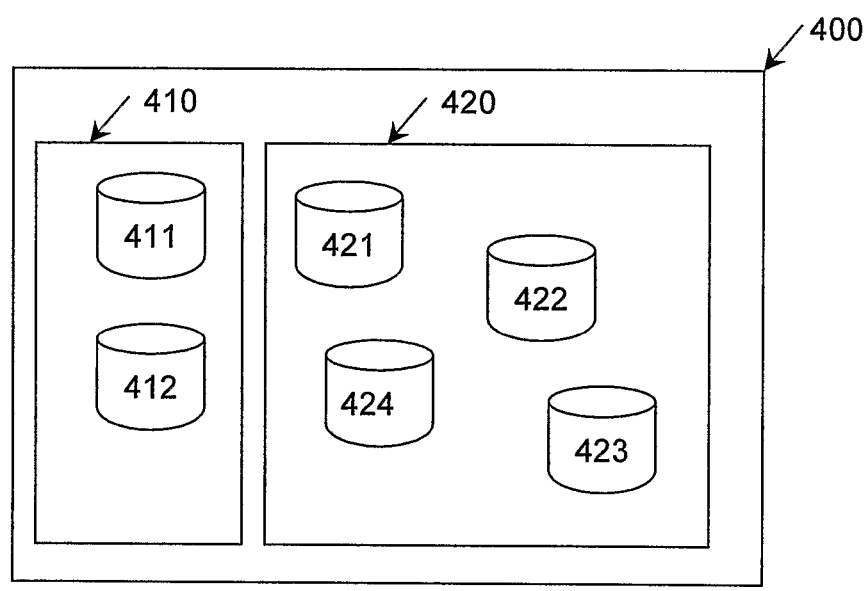
FIG. 7 is a block diagram of a flash memory system of the client processor device.

The flash file system of the client processor device 100 receives and stores files in the flash memory 120 for processing by the virtual machine 321 of the OS. The flash file system 400, as shown in FIG. 7, is a linear file system that allows up to 64 files of up to 64 kbyte to be stored in the flash memory 120. The file system allows storage of files (e.g. files 411, 412), in a write-protected area 410 and optionally in a read-write area 420 (e.g. file 421, 422, 423, 424), as shown in FIG. 7. The write-protected area is read-only if the device is not in an initial configuration state, otherwise write access is allowed. The flash file system supports 512 kbyte and 1 Mbyte data flash devices 120 and this does not preclude other device sizes or numbers of devices, if required.

Figure 8:
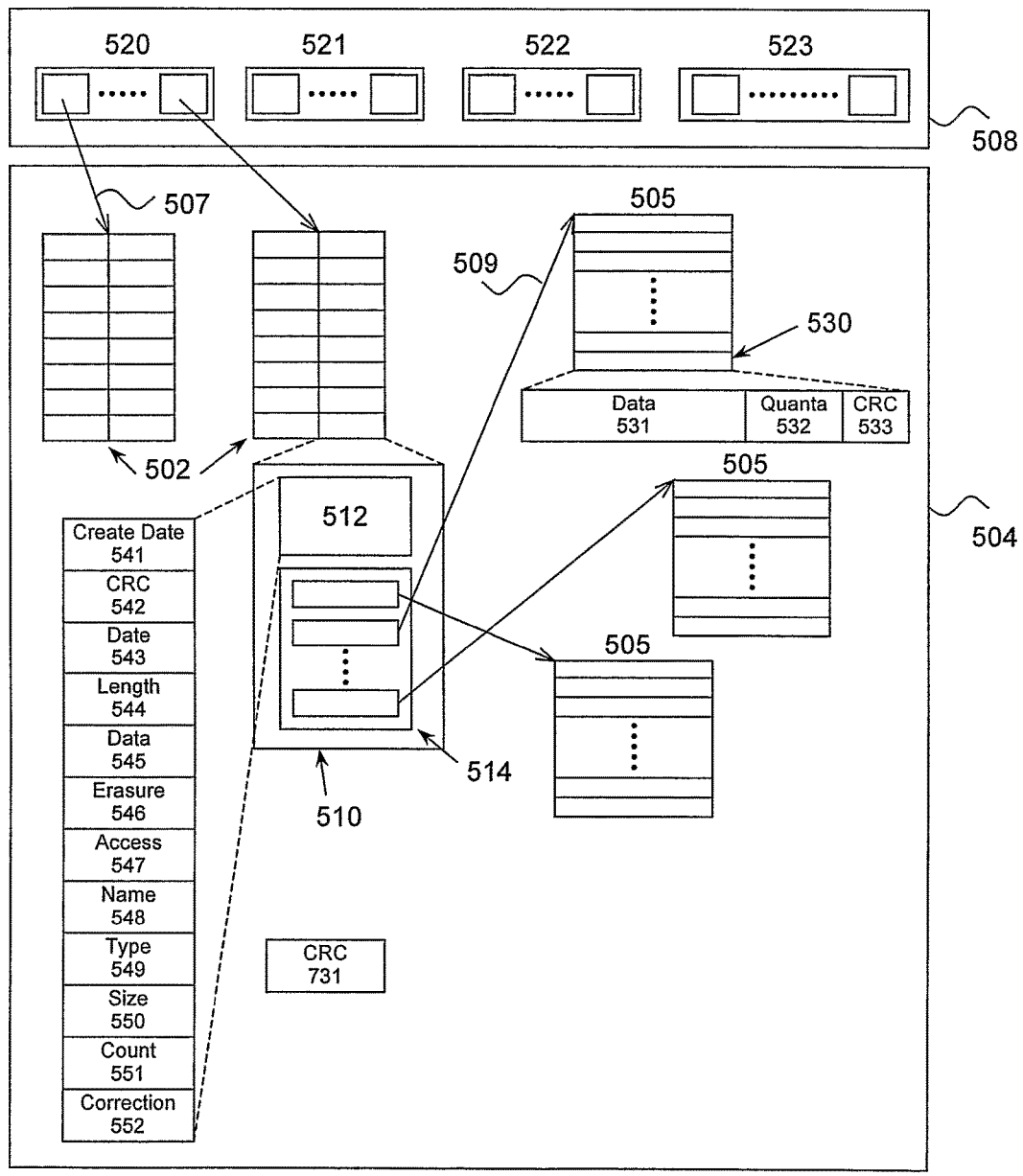
FIG. 8 is a block diagram of the flash file system architecture of the client processor device.

The data-flash memory 120 is divided up into 264 byte pages, where 256 bytes are used for actual data, and the 8 spare bytes are used for indicating what portions of the page contain valid data. A structure is used, as shown in FIG. 8, where 508 represents RAM components and 504 the components stored in the data-flash memory 120. One or two flash blocks are treated as an allocation unit, depending on the device capacity, so that a total of 256 allocation units are available. An allocation unit may be a directory unit 502, or a data unit 505. The directory units 502 each include directory entries 510 having a header 512 and a table 509. The header 512 includes information about the file, such as its local creation date 541, CRC 542, release date 543, length 544, data quanta count 545, erasure quanta count, 546, access mode 547, name 548, type 549, quanta size 550, quanta count 551, erasure correction 552. Table 514 includes pointers 509 to the data allocation units 505 that actually hold the data for the file. Each data allocation unit holds one or two blocks, being eight or sixteen pages 530 depending on the flash device capacity. A page 530, containing valid data, consists of 256 bytes of data 531, 4 bytes of quanta 532, and a 32-bit CRC. The quanta 532 represents up to 32 indicator flags, which indicate which bytes of the data 531, are valid. The RAM 108 maintains a set of tables 520, which each have pointers 507 to predefined number of directory units 502 which each include 16 or 32 directory entries 510 per unit, depending on flash device capacity.

Allocation units in write-protected flash and those in read-write flash are allocated from pools 521 and 522, respectively, representing free allocation units, maintained in RAM 108.

A table 523 is maintained for the state of all directory entries 510 in the directory allocation units 502 in the write-protected and read-write areas of the flash memory 120. The state defines whether the directory entry 510 contains an allocated file header 512, and if so, the file's name and flags indicating, whether it is complete, and any request that it be deleted. For a complete file additional state flags indicate whether it is released, for use by the virtual machine. The state also indicates whether a released the file is locked and/or open.

A count of the total number of writes to each allocation unit is maintained in a table in EEPROM 109. The count is used to ensure the next allocation unit with the lowest count is used thereby achieving even wear of the flash. If this count exceeds a threshold, then the file system will not reallocate the allocation unit, and it can be treated as allocated in order to avoid further access to it. A free allocation unit with the least number of writes to it is allocated first. The file system updates the pointers accordingly if allocation units are moved due to a worn unit.

Figure 13:
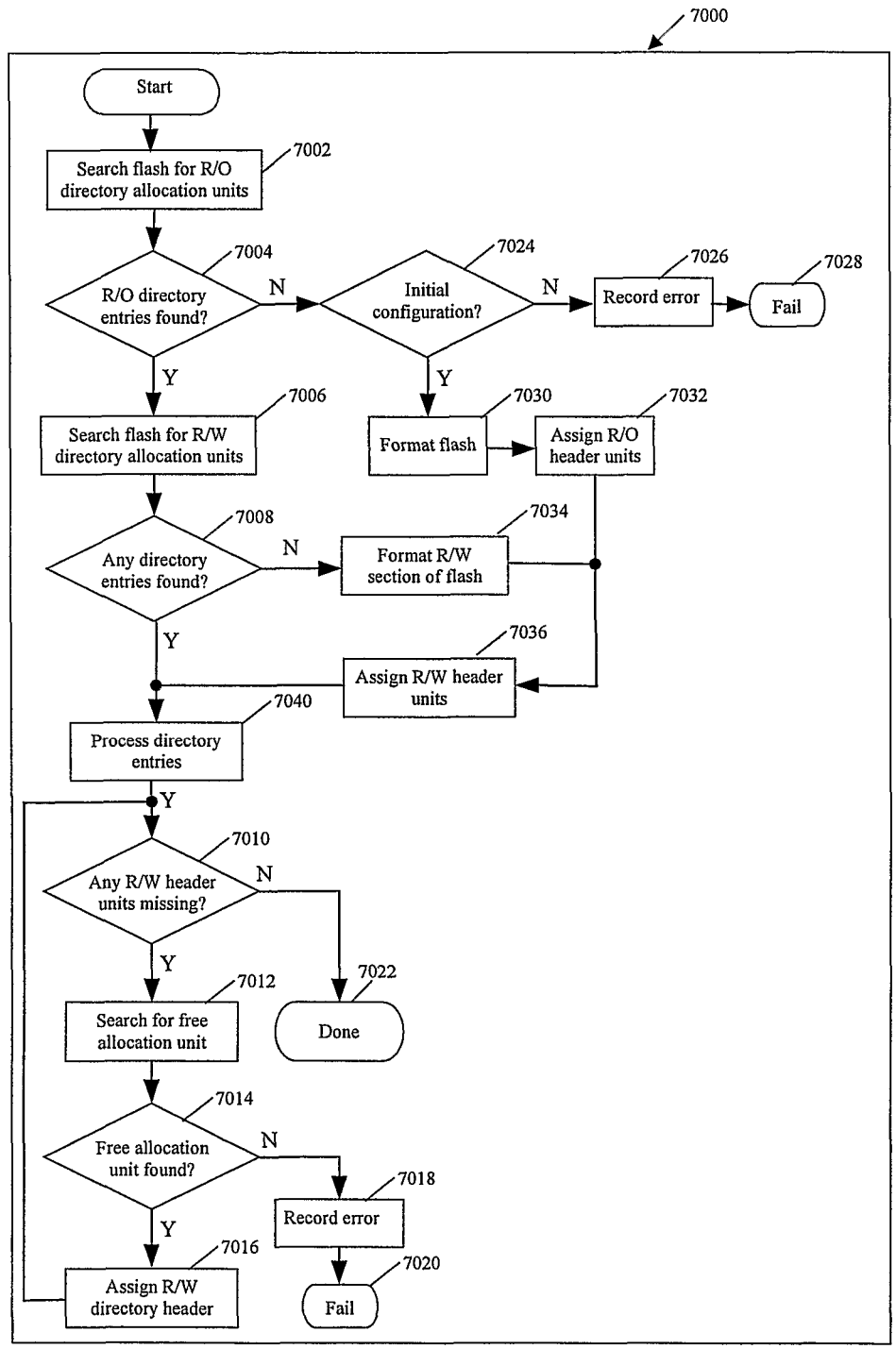
FIG. 13 is a flow diagram of an initialisation procedure for the flash memory system.

The flash file system task 223 on initialisation executes a start up procedure 7000, as shown in FIG. 13. The start up procedure 7000 begins at step 7002 by searching the write-protected area 410 of the flash memory 120 for the expected number of directory allocation units 502. Step 7004 determines whether such directory allocation units are found. If all units are found, step 7004 proceeds to step 7006 to search the read-write area 420 of the flash memory 120 for directory allocation units. Then, if step 7008 determines that directory allocation units are found in the read-write area, step 7008 proceeds to step 7080, where all directory entries are processed.

However, if step 7004 determines that the expected number of directory allocation units are not found in the write-protected area, step 7004 proceeds to step 7024, to determine whether the unit is in an initial configuration state. Initial configuration occurs at manufacture being indicated by a dedicated hardware signal. If step 7024 determines that the unit is not being configured, step 7026 records the error and, at step 7028, a signal is generated to indicate that the flash file system has failed to start.

If step 7024 determines that the unit is being configured, step 7024 proceeds to step 7030 to format the flash memory 120 (e.g. by deleting data from both the write-protected and read-write areas of the memory 120). At step 7032, header units in the write-protected area are created, and at step 7036, header units in the read-write area are similarly created. Step 7036 proceeds to step 7040 to process all directory entries, as shown in FIG. 14.

If step 7008 determines that directory allocation units 502 are not found in the read-write area, step 7008 proceeds to step 7034 to format only the read-write area. Step 7034 proceeds to step 7036 to create header units in the read-write area. Step 7036 proceeds to step 7040 to process all directory entries, as shown in FIG. 14.

Once all the directory entries have been processed, step 7040 proceeds to step 7010 to determine whether any of the directory allocation units 502 in the read-write area of the memory 120 are missing. If none are missing, step 7010 proceeds to step 7022 to start the file system. Otherwise, step 7010 proceeds to step 7012 to search for a free allocation unit in table 52 (e.g. in the read-write area). Step 7014 determines whether a free allocation unit has been found. If found, step 7014 proceeds to step 7016 to assign the free allocation unit as a directory entry. Step 7016 the proceeds to step 7010 to continue processing other directory entries. If step 7014 determines that a free allocation unit cannot be found, step 7014 proceeds to step 7018 to record the error, and at step 7020, generates a signal indicating that the file system has failed to start.

Figure 14:
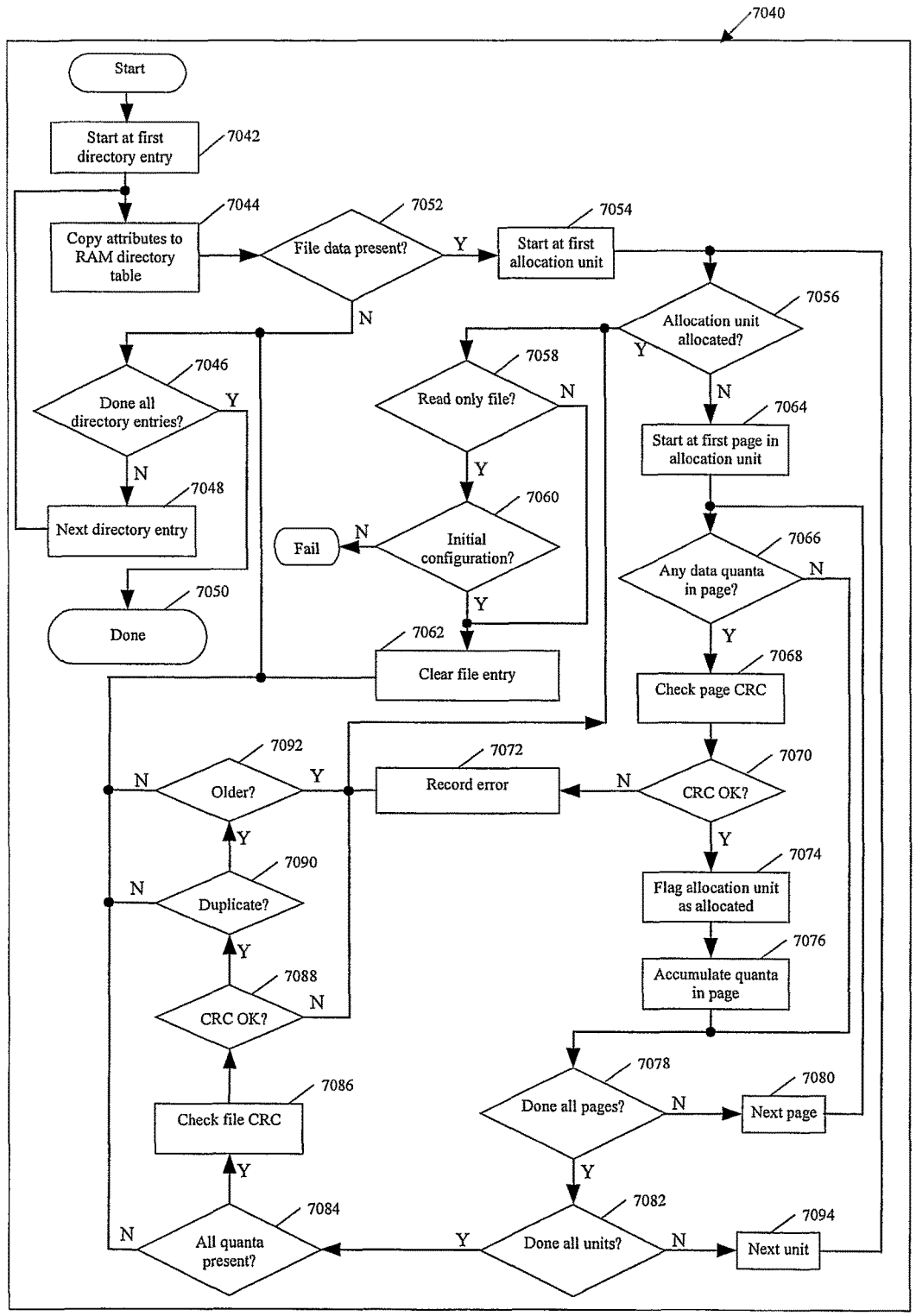
FIG. 14 is a flow diagram of a directory entry initialisation procedure for the initialisation procedure of the flash memory system.

The process shown in FIG. 14 processes all directory entries in order to ascertain the files resident in the flash memory, the state and integrity of each file (i.e. whether complete, incomplete or corrupted) and the allocation units used. No assumptions are made about the state or number of files, or data allocation units prior to this process.

Step 7042 is the first step for individually processing each directory entry 510 in the directory allocation units 502 in the write-protected area, and also the directory allocation units in the read-write area of memory 120. Each directory entry 510 potentially contains data related to a file (e.g. 411, 421). Step 7042 selects a directory entry for processing. At step 7044, the file name 548 represented by the selected directory entry (contained in header of the selected directory entry), and the file location (e.g. write-protected or read-write), and attributes such as completeness are entered into a RAM directory table 523. Step 7052 then determines whether the selected directory entry contains file data. If step 7052 determines that the file contains no data, step 7052 proceeds to step 7046 which determines whether all the directory entries identified by the directory allocation units (eg. 502) in memory 120 have been processed. If so, step 7048 proceeds to step 7050 indicating all directory entries have been processed. Otherwise, step 7046 proceeds to step 7048, which selects another directory entry from the directory allocation units in memory and proceeds to step 7044.

If step 7052 determines that the file contains data, step 7052 proceeds to step 7054 to select a data allocation unit 505 corresponding to the file (e.g. by retrieving the pointer to the first data allocation unit (e.g. 505) from the table (e.g. 514) for the selected directory entry). Step 7054 then proceeds to step 7052 to process the selected data allocation unit by determining whether that unit has been allocated in memory 120 by checking table 522. If so, step 7056 proceeds to step 7058 to first determine whether the file can entry can be deleted from the corresponding directory allocation unit (as the allocation unit is incorrectly in use by another file) by determining whether the file is in write-protected space. Otherwise, step 7056 proceeds to step 7064 to check the contents of the selected data allocation unit.

If step 7058 determines the file is in write-protected space, step 7058 proceeds to step 7060 which determines if the device is in an initial configuration state. Otherwise, step 7058 proceeds to step 7062 to clear the file entry. If step 7060 determines the device is not in an initial configuration state, step 7060 proceeds to step 7094 to indicate an unrecoverable error. Otherwise, step 7060 proceeds to step 7062 to clear the file entry by de-allocating all data allocation units referred to in the by the file's header table 514, except the data allocation unit already in use by another file, then clearing the file's directory entry 510. Step 7062, then proceeds to step 7046 which determines whether all the directory entries have been processed. If so, step 7046 proceeds to step 7050 indicating that all directory entries have been processed. Otherwise, step 7046 proceeds to step 7048 to select a new directory entry and proceeding to step 7044.

Step 7064 proceeds to check the contents of the selected allocation unit 505 by selecting the unit's first page and proceeding to step 7066. Step 7066 determines whether the selected page 530 contains any data by checking whether the data quanta flags 532 indicate any data bytes are present. If so, step 7066 proceeds to step 7068 to check the CRC of the selected page by evaluating the CRC of the data 531 and quanta flags (e.g. 532) Otherwise, step 7066 proceeds to step 7078 to check whether all the pages in the allocation unit have been processed.

Step 7068 proceeds to step 7070 to check whether the evaluated CRC in step 7068, matches the stored CRC 533. If not, step 7070 proceeds to step 7072 to record the error and, at then proceeds to step 7058 to delete the file entry from the corresponding directory allocation unit, if allowed. Otherwise, step 7070 proceeds to step 7074 to set a flag in table 522 indicating that the data allocation unit 305 has been allocated.

Step 7074 proceeds to step 7076 to record a running total of the amount of data quanta contained in the data pages, and proceeds to step 7078 to check whether all the pages in the allocation unit have been processed. If not, step 7078 proceeds to stop 7080 to select another page in the data allocation unit for processing, and proceeds to step 7056. Otherwise, step 7078 proceeds to step 7082 to determine whether all the data allocation units for the file (as defined in the directory entry) have been processed. If not, step 7082 proceeds to step 7094 to select another data allocation unit for the same file (e.g. another pointer to a data allocation unit for that file), and the new selected data allocation unit is processed at step 7056.

If step 7082 determines that all the data allocation units for the file have been processed, step 7082 proceeds to step 7084. Although all the data allocation units for a file (as defined in the directory entry) have been processed, the file may still be incomplete. Step 7084 determines whether the data for the file is complete by whether the quanta accumulated in step 7076 matches the expected quanta count (e.g. 545) in the file header 540. If not, step 7084 proceeds to step 7046 to select another directory entry. Otherwise, step 7084 proceeds to step 7086 to check the CRC data for the file as a whole. Step 7088 determines whether the CRC check at step 7086 indicates that all the data contained in the file is consistent with the file CRC 543 contained in the header 540. If not, step 7088 proceeds to step 7058 to delete the file entry from the corresponding directory allocation unit, if allowed. Otherwise, step 7088 proceeds to step 7090.

Step 7090 determines whether the file presently being processed is a duplicate of another file in the flash file system by comparing file header (e,g, 512) parameters. If step 7090 determines that the file is not a duplicate, step 7090 proceeds to step 7046 to select a new directory entry. Otherwise, step 7090 proceeds to step 7092 to determine whether the date/time stamp on the present file 543 represents a time that is earlier than the date/time of another file of which the present file is a duplicate. If so, step 7092 proceeds to step 7058 to check if the file entry can be deleted from the corresponding directory allocation unit.

Otherwise, step 7092 proceeds to step 7046 to 7046 to check whether all the directory entries have been processed.

The failures identified in flash memory initialisation processes 7000 and 7040 may occur as a result of corruption or loss of data in one or more flash memory pages. Possible causes of such corruption may be power failure or system re-boot whilst the data is being written to the device 100, or random data bit-errors due to wear and/or cross-talk between pages. It is beneficial to guard against these modes of failure and reducing their severity if they do occur. This can be achieved by modifying the file system to:

(a) wear the flash memory as evenly as possible;
(b) ensure loss of a single data page never affects more than one file; and
(c) ensure corruption, or loss, of a single page can be recovered.

The first two are satisfied by employing distributed file directory headers throughout the flash memory (e.g. within the first data allocation unit of each file), rather than aggregating them in a few allocation units. The last can be addressed, at least in part, by using duplicate directory headers for each file, each on separate flash memory pages, to allow a corrupted header to be recovered from the intact header. To recover a lost page from the data area of a file, a simple erasure correction can be implemented by storing an additional page (e.g. along with the duplicated directory headers), to provide a page-wise parity of all data pages in the file. A corrupt header or data page can be identified by the failure of the CRC associated with each page written to flash.

Figure 15:
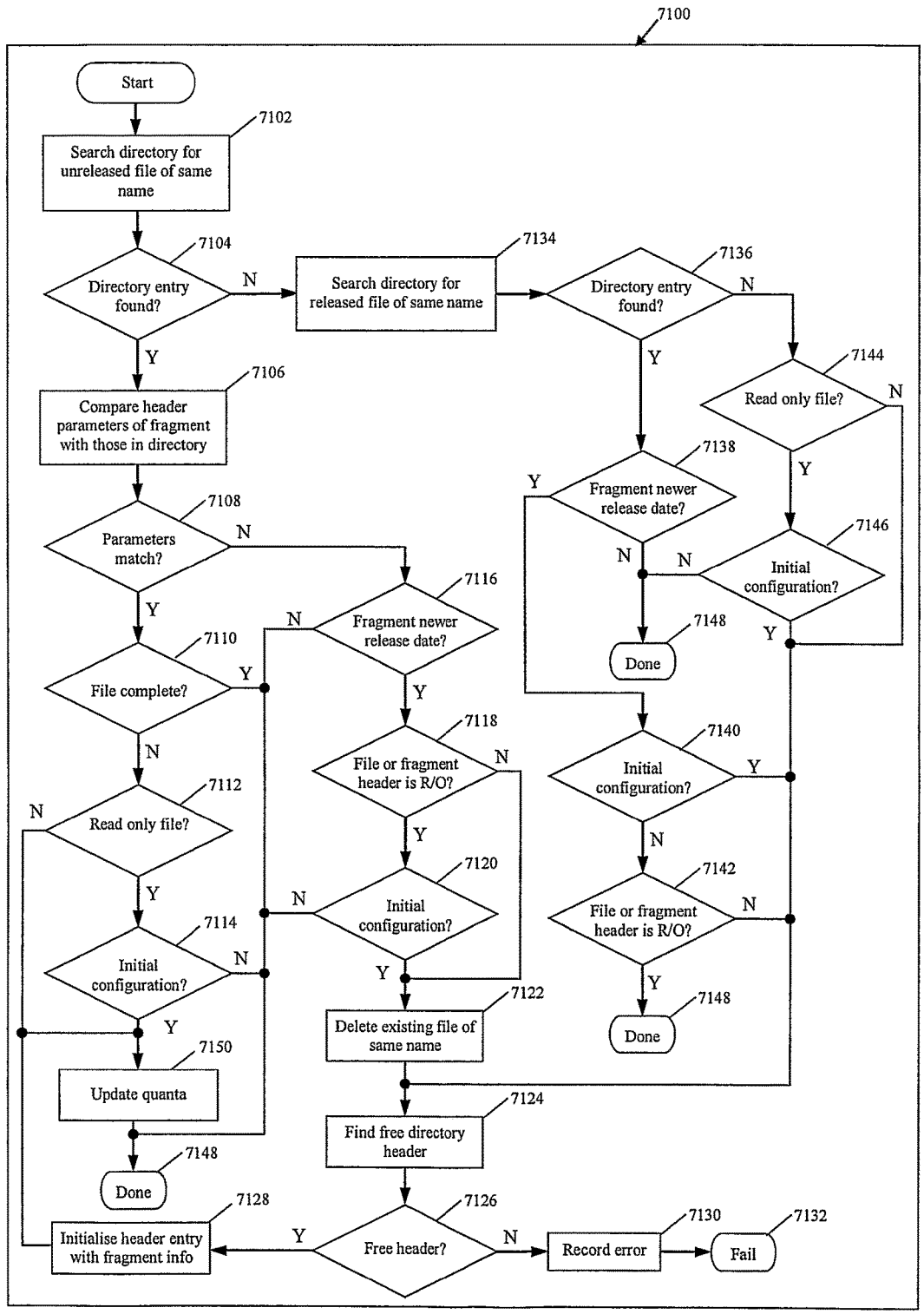
FIG. 15 is a flow diagram of a receive process of the flash memory system.

The flash file system processes file fragments received by the receiver 110 to perform a receive process 7100, as shown in FIG. 15. Space in the flash 120 is only allocated for the actual fragments received, to reduce overhead, and each file fragment is time stamped with its local creation date 541, in addition to a release date 543 determined by the transmitting server. Fragments can be received in different orders and multiple files received at once, which allows for interleaved transmission and prompt transmission of high priority files.

The receive process 7100 as shown in FIG. 15 begins at step 7102 on receiving a file fragment. Step 7102 searches the RAM directory table 523 for an unreleased file (i.e. an incomplete file or completed file not in the released state) with the same name 548 as the file fragment received. Step 7102 then proceeds to step 7104 to determine whether such an incomplete file exists in the RAM directory table 523. If found, step 7104 proceeds to step 7106, which compares the header parameters of the fragment with those of the existing file. If an unreleased file is not found, step 7104 proceeds to step 7134 to search the RAM directory table 523 for a complete file in the released state with the same name as the file fragment received.

Step 7106 then proceeds to step 7108, to determine whether the header parameters (i.e. 542 to 552) of the fragment received and the existing file match. If so, step 7108 proceeds to step 7110, which checks whether the file is completed. Otherwise, step 7108 proceeds to step 7116, which determines whether the file is obsolete by checking whether the release date 543 of the fragment received is newer than that of the existing incomplete file.

If the file is determined as complete in step 7110, step 7110 proceeds to step 7148, to end process 7100. Otherwise, step 7110 proceeds to step 7112 which determines whether the existing unreleased file is in the write-protected section of flash memory 120. If step 7112 determined that the file is write-protected, step 7112 proceeds to step 7114, which determines whether the device is in the initial configuration state which allows writes to the write-protected section of flash memory. Otherwise, step 7112 proceeds to step 7150; a process which updates the incomplete file in flash memory with the data received.

If step 7114 determines that the write-protected section is writable, step 7114 proceeds to step 7150, to update the incomplete file in write-protected flash memory. Otherwise, step 7114 proceeds to step 7148, to end process 7100, with the file fragment received being discarded, as the write-protected section 410 of the flash memory 120 is read-only.

If step 7116 determines that the fragment is newer, step 7116 proceeds to step 7118, which checks whether either the file fragment has a read-only access flag (e.g. 547), indicating that it should be stored in the write-protected area, or that the existing file is in the read only section of flash memory 120. Step 7118 ensures a file of the same name may not exist in both write-protected and read-write areas of the flash memory.

If step 7118 indicates neither the fragment nor the existing file is read-only access, step 7118 proceeds to step 7122, which deletes the existing incomplete file as it has been made obsolete by the newer file fragment. Otherwise, step 7118 proceeds to step 7120 which checks whether write access to the write-protected area of the flash memory system is available. If so, step 7120 proceeds to step 7122 to delete the existing incomplete file by setting the delete flag in the corresponding entry in the directory table 523. Otherwise, step 7120 proceeds to step 7148, to end process 7100. Step 7122 proceeds to step 7124, which attempts to search for a free directory header in the appropriate write-protected 410 or read-write 420 areas of the flash memory depending on the read-only access flag in the received file fragment. The result of the search in step 7124 is checked in step 7126. If the search located a free header step 7126 proceeds to 7128 to initialize the fields (e.g. 542 to 552) in a new directory header 512 with the header information from the received file fragment, and the local time field 541 with the current time maintained by the clock task 225. Otherwise, step 7128 proceeds to step 7130 to record a failure to locate a free header, which proceeds to step 7132 to indicate a file system failure.

Step 7128 also flags the status of the new file as incomplete in the RAM directory table 523, and proceeds to step 7150 to commence storing the fragment as a new file.

Based on the search performed at step 7134, step 7136 determines whether a released file with the same name as the file fragment received exists in memory 120. If no such file exists, step 7136 proceeds to step 7144. However, if a released file is found, step 7136 proceeds to step 7138 to compare the release dates of the file and the file fragment. If the file fragment is newer, step 7138, proceeds to step 7140 to check whether the device is in an initial configuration state. If so, step 7140 proceeds to step 7124 commence storing the file fragment as a new file. Otherwise step 7140 proceeds to step 7142, which checks whether either the file fragment has a read-only access flag (e.g. 547), indicating that it should be stored in the write-protected area, or that the existing file is in the write-protected section of flash memory 120. If step 7142 indicates neither the fragment nor the existing file is read-only access, step 7142 proceeds to step 7124 to commence storing the file fragment as a new file. Otherwise, step 7142 proceeds to step 7148 to end process 7100.

Step 7144 determines whether the data in the file fragment received belongs to a file intended for storage in the write-protected area of memory 120 (e.g. based on access mode data stored in the file fragment). If so, step 7144 proceeds to step 7146 to determine whether the unit is in an initial configuration state, which allows write-access to the write-protected section 410 of the flash memory. Otherwise, step 7144 proceeds to step 7124 to commence storing the file fragment as a new file. If step 7146 determines the unit is in initial configuration, step 7146 proceeds to step 7124 to commence storing the fragment as a new file. Otherwise, step 7142 proceeds to step 7148 to end process 7100.

Figure 16:
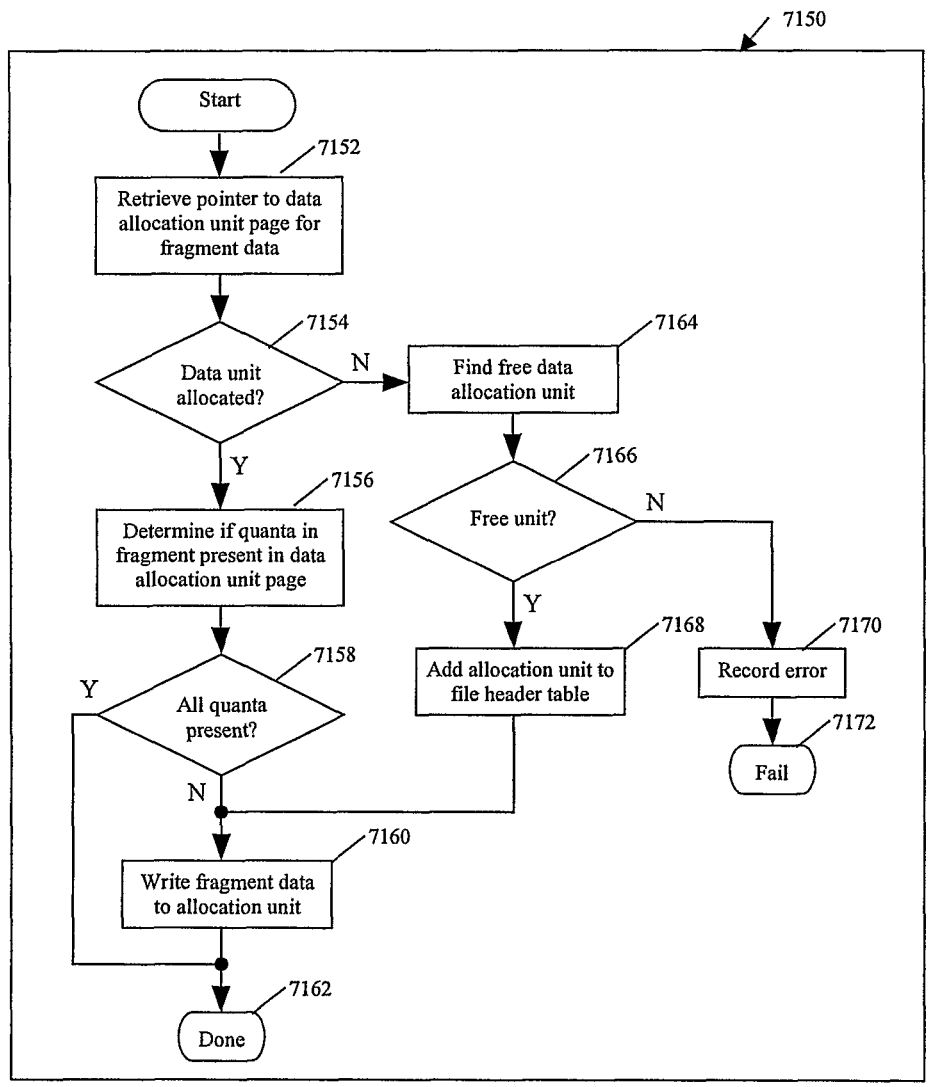
FIG. 16 is a flow diagram of an update quanta process of the receive process of the flash memory system.

The process 7150 to update an incomplete file with the data quanta received in a file fragment is shown in FIG. 16. The update quanta process begins at step 7152 by retrieving the pointer to the page 530 in the data allocation unit where the data contained in the file fragment is destined to be written. The data allocation unit is identified by indexing the table of data allocation unit pointers (e.g. 514) in the file's directory entry. The index is calculated by using the starting quanta number (e.g. 741) in the file fragment received, the quanta size (e.g. 550) and the number of quanta held by each data allocation unit.

It is assumed quanta in the file fragment do not overlap pages 530 in data allocation units, however it is straightforward to enhance the procedure to cater for file fragments that contain data that may overlap pages.

Step 7152 proceeds to step 7154, which determines whether a data allocation unit identified by step 7152 has been allocated in the data allocation unit table (e,g, 514) in the file's directory entry. If so, step 7154 proceeds to step 7156, which determines if the page identified in step 7152 contains all data quanta present in the file fragment received. Otherwise, step 7154 proceeds to step 7164, which searches the relevant pool of allocation units (e.g. 521 or 522) for a free data allocation unit depending on the read-only access flag of the file (e.g. 547). If step 7156 determines all data in the fragment are present in the file, step 7158, following step 7156, proceeds to step 7162 to end the update quanta process 7150. Otherwise, step 7158 proceeds to step 7160 to write the data in the fragment to the page and end the update quanta process 7150 at step 7162. Step 7164 proceeds to step 7166, which determines whether the search for a free allocation unit was successful. If so, step 7166 proceeds to step 7168, which adds a pointer (e.g 509) to the free allocation unit to the index in the file's header table (e.g. 514), and proceeds to step 7160 to write the fragment to the allocation unit. Otherwise, step 7166 proceeds to step 7170, which records an error, and proceeds to 7172 to end the update quanta process 7150 with a failure.

Figure 17:
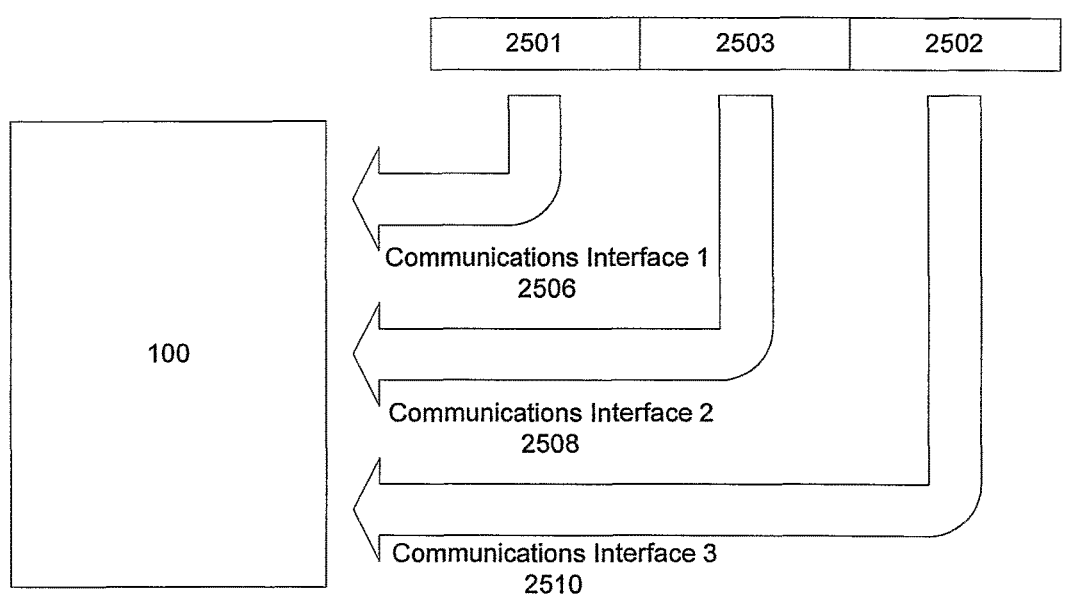
FIG. 17 is a block diagram of the client device receiving files from the server transmission system via a variety of network interfaces.

FIG. 17 shows the client device 100 receiving files from the server transmission system as file fragments 2501, 2502 and 2503. The file fragments 2501, 2502 and 2503 may be sent to the client device 100 via a different communications interface 2506, 2508, 2510 (e.g. interfaces for a paging network, a wireless network, the Internet, or a direct connection with the client device 100). The file fragments 2501, 2502 and 2503 do not have to be sent or received in any particular sequence. When the client device 100 receives all the file fragments 2501, 2502 and 2503, the device 100 reorganises all the fragment into their proper sequence for processing (e.g. based on the fragment identifier for each file fragment 2501, 2502 and 2503 indicating their sequence).

Similarly, commands and configuration data can be sent to the client device 100 via a different communications interfaces.

The file system also implements erasure correction recovery of missing fragments. All files have an associated 32-bit cyclic redundancy check (CRC) and a CRC calculated locally and stored for every page to check the integrity of the data stored in the flash memory page. These erasure correction pages follow the end of the file. A file missing core fragments also has provision for Erasure Error Correction (EEC) data at the end, and when the necessary file data is received or able to be reconstructed using the EEC data, any EEC data is freed and file marked as "complete".

Once the file is complete, it cannot be altered or patched by the VM task 213, but can only be deleted by the flash file system.

The flash file system supports a locking mechanism to prevent them from being deleted during a garbage collection process performed by the file system task, particularly if a new version of the file is available. A locked file gives an application guaranteed access to that file. The flash file system always locks existing files on initialisation and newly completed files. Files can only be unlocked by the application.

Figure 18:
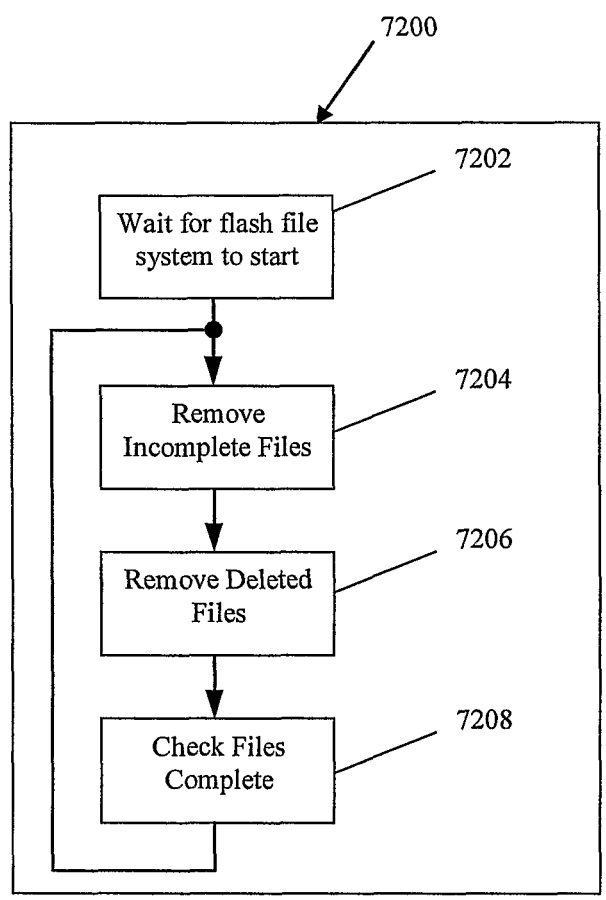
FIG. 18 is a flow diagram of a file house keeping process of the flash memory system.
Figure 19:
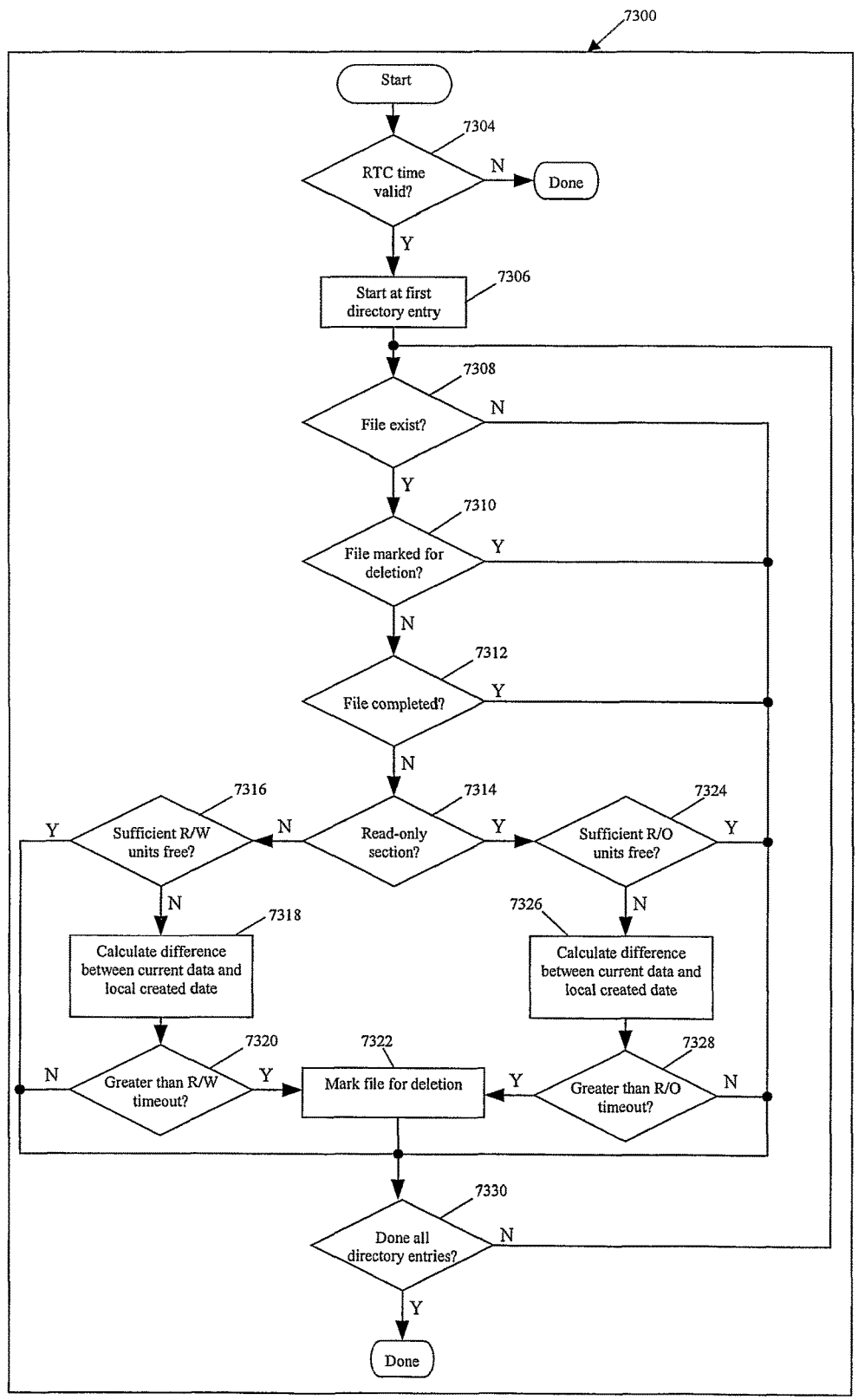
FIG. 19 is a flow diagram of an incomplete file removal process of the flash memory system.
Figure 20:
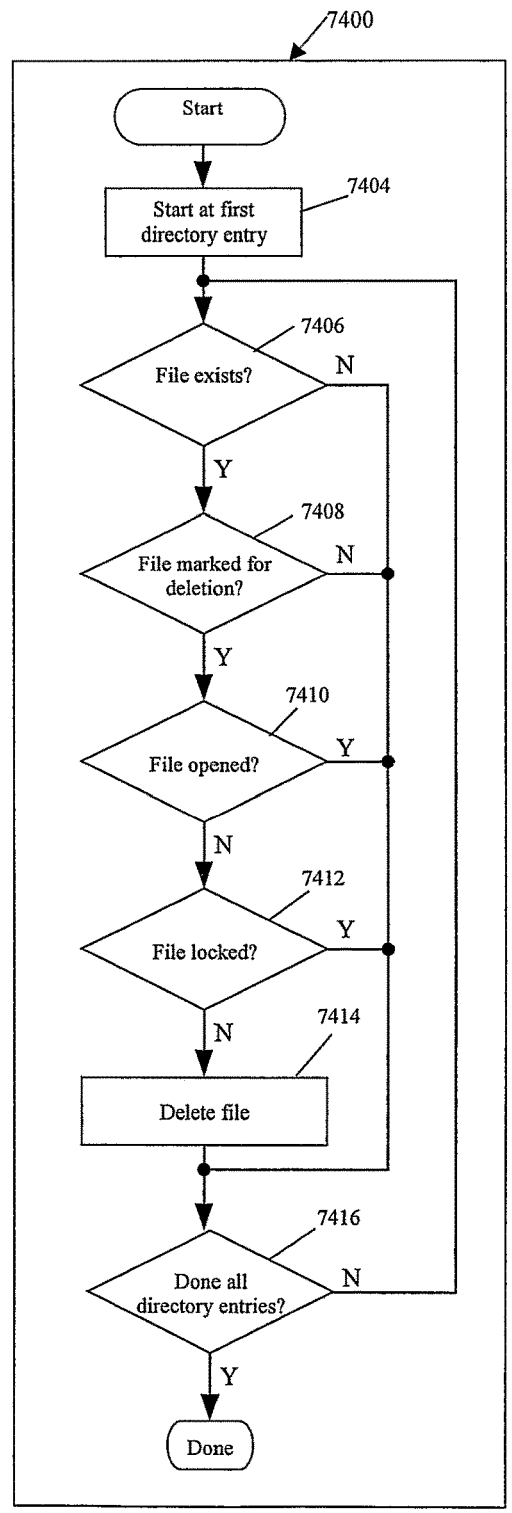
FIG. 20 is a flow diagram of a file deletion process of the flash memory system.
Figure 21:
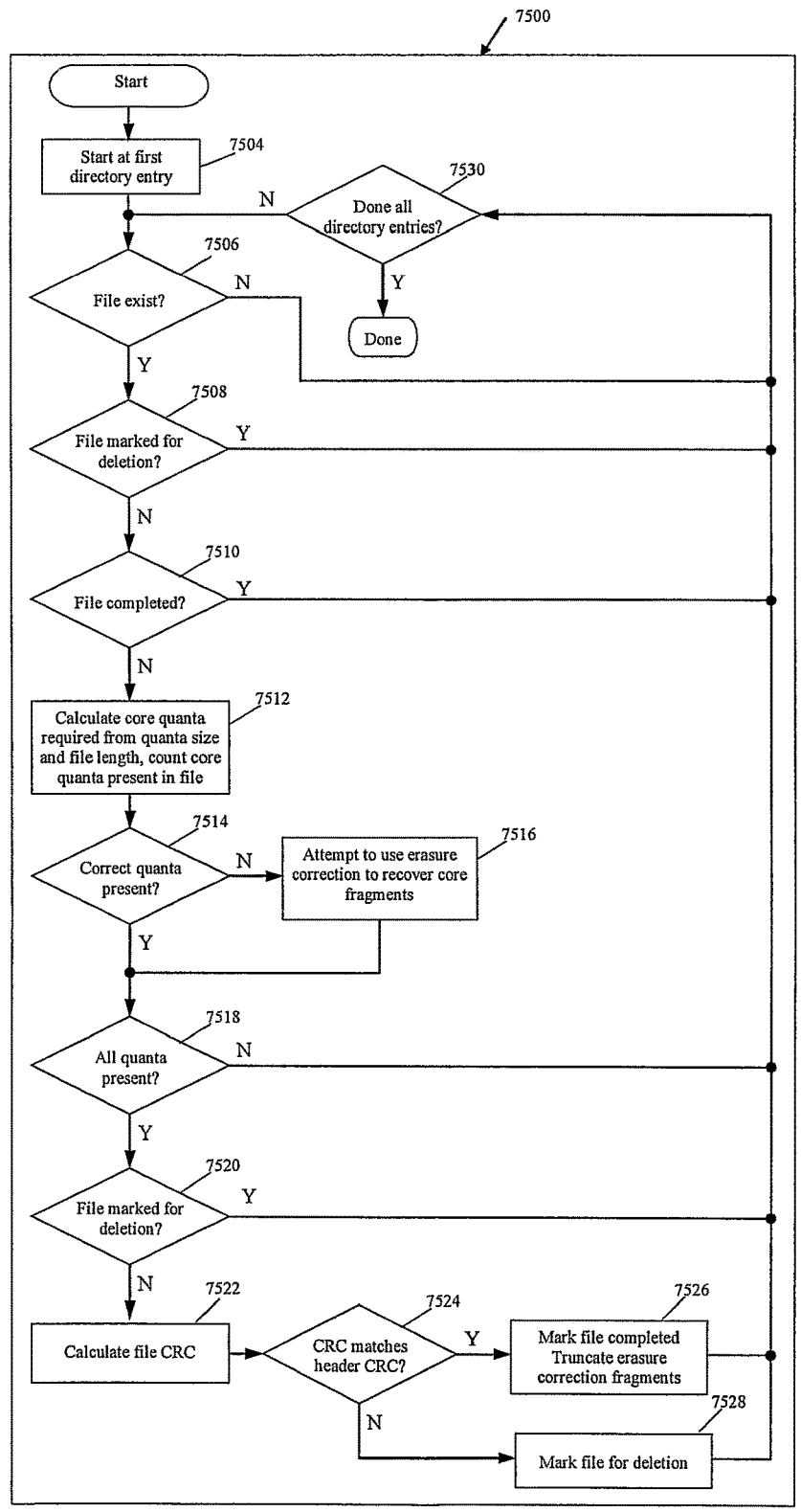
FIG. 21 is a flow diagram of a building missing fragments process of the flash memory system.

The file system housekeeping process 7200 is shown in FIG. 18. Once the flash file system is started at step 7202, process 7200 executes a number of procedures in turn to remove incomplete files (at step 7204), remove deleted files (at step 7206) and to check completed files for deletion (at step 7208). The function of steps 7204, 7206 and 7208 are described in further detail with reference to processes 7300, 7400 and 7500 respectively, as depicted in FIGS. 19, 20 and 21. The actions of determining which file to delete and actually deleting them are made separate by the use of a deletion flag to indicate to the deletion process that the file is a delete candidate. This allows the relatively slower deletion process shown in FIG. 20 to be handled by the housekeeping task 223 thereby speeding up any process which wishes to delete a file.

FIG. 19 is a flow diagram of the process 7300 for removing incomplete files if they are not completed within a specified time. If the number and type of free allocation units (i.e write-protected or read-write), related to the access mode of the file, fall below a preset threshold less time is allowed for incomplete files to become complete to free up more allocation units. Process 7300 begins at step 7304 by determining whether the Real Time Clock (RTC) of the microprocessor 102 is returning a valid time value. If the RTC output is not a valid time value, process 7300 ends and execution returns to process 7200. Otherwise, if the RTC output is valid, step 7304 proceeds to step 7306 to locate a first directory entry in the flash memory 120 for processing. Step 7306 proceeds to step 7308 to retrieve data stored in the directory entry and determine whether the directory entry corresponds to a file. If the directory entry does not correspond to a file, step 7308 proceeds to step 7330. Otherwise, step 7308 proceeds to step 7310 to determine whether the file has been marked for deletion. If the file has been marked for deletion step 7310 proceeds to step 7330. Otherwise, step 7310 proceeds to step 7312 to determine if the file is complete. If so, step 7312 proceeds to step 7330. Otherwise, step 7312 proceeds to step 7314 to determine if the file is stored in the write-protected section of the flash memory 120 (i.e. read-only memory if not in initial configuration).

If the file is stored in write-protected memory, step 7314 proceeds to step 7324 to determine if there are sufficient free allocation units in the read-only memory for storing more data. If the write-protected memory has sufficient capacity, step 7324 proceeds to step 7330. Otherwise, step 7326 generates the time difference between the local creation date of the file (i.e. the time when the first portion of the file was stored in memory 120) and the time at which the most recent portion of the file was received. Then, step 7328 determines whether the time difference generated at step 7326 exceeds the predetermined timeout value for the write-protected memory. If the generated time difference exceeds the timeout value for the write-protected memory, then step 7328 proceeds to step 7330. Otherwise, step 7328 proceeds to step 7322 to mark the file for deletion.

If the file is stored in the read-write section of the flash memory 120 (i.e. read-write memory), then step 7314 proceeds to step 7316 to determine if there are sufficient free allocation units in the read-write memory for storing more data. If the read-write memory has sufficient capacity, step 7316 proceeds to step 7330. Otherwise, step 7318 generates the time difference between the local creation date of the file (i.e. the time when the first portion of the file was stored in memory 120) and the time at which the most recent portion of the file was received. Then, step 7320 determines whether the time difference generated at step 7318 exceeds the predetermined timeout value for the read-write memory. If the generated time difference exceeds the timeout value for the read-write memory, then step 7320 proceeds to step 7330. Otherwise, step 7328 proceeds to step 7322 to mark the file for deletion.

Step 7322 marks the file for deletion (e.g. by setting the deletion flag for the file) and proceeds to step 7330 to determine whether all directory entries in the memory 120 have been processed. If so, process 7300 ends and execution returns to process 1200. Otherwise, step 7330 proceeds to step 7308, where a different directory entry is selected and processed.

FIG. 20 is a flow diagram of the process 7400 for removing files marked for deletion from the memory 120. Process 7400 begins at step 7404 by locating a first directory entry in the flash memory 120 for processing. Step 7404 proceeds to step 7406 to retrieve data stored in the directory entry and determine whether the directory entry corresponds to a file. If the directory entry does not correspond to a file, step 7406 proceeds to step 7416. Otherwise, step 7406 proceeds to step 7408 to determine whether the file has been marked for deletion by examining the file's status in the directory table 523. If the file has not been marked for deletion step 7408 proceeds to step 7416. Otherwise, step 7408 proceeds to step 7410 to determine if the file is open (e.g. currently being opened or used). If so, step 7410 proceeds to step 7416. Otherwise, step 7410 proceeds to step 7412 to determine if the file is locked (e.g. locked so it will not be deleted). If so, step 7412 proceeds to step 7416. Otherwise, step 7412 proceeds to step 7414 to delete the file. Step 7414 proceeds to step 7416 to determine whether all directory entries in the memory 120 have been processed. If so, process 7400 ends and execution returns to process 7200. Otherwise, step 7416 proceeds to step 7406, where a different directory entry is selected and processed. The main file system housekeeping loop is also responsible for checking incomplete files and building any missing fragments using received erasure correction fragments where possible, as depicted in FIG. 21. A CRC is performed on any newly completed files to check their integrity. The process of assembling files is decoupled from the receive fragment process shown in FIG. 15, to simplify both.

FIG. 21 is a flow diagram of the process 7500 for marking incomplete files for deletion from the memory 120. Process 7500 begins at step 7504 by locating a first directory entry in the flash memory 120 for processing. Step 7504 proceeds to step 7506 to retrieve data stored in the directory entry and determine whether the directory entry corresponds to a file. If the directory entry does not correspond to a file, step 7506 proceeds to step 7530.

Step 7530 determines whether all the directory entries in the memory 120 have processed.

If so, process 7500 ends and execution returns to process 7200. Otherwise, step 7530 selects another directory entry from memory 120 and proceeds to step 7506 to process the new directory entry.

If step 7506 determines that the directory entry corresponds to a file, step 7506 proceeds to step 7508 to determine whether the file has been marked for deletion. If so, step 7508 proceeds to step 7530. Otherwise, step 7508 proceeds to step 7510 to determine whether the file is complete. If the file is complete, step 7510 proceeds to step 7530. Otherwise, step 7510 proceeds to step 7512 to generate the core quanta present in the file (i.e. the amount of data for the file, excluding the erasure correction fragments) and the core quanta still required (i.e. the amount of data still required for the file to be complete). The core quanta required may be determined, for example, by subtracting the core quanta present in the file from the file length. Step 7512 proceeds to step 7514 to verify whether the quanta present for the file (determined at step 7512) is actually stored in the file system. If so, step 7514 proceeds to step 7518. Otherwise, step 7514 proceeds to step 7516 to attempt to record core quanta of the file using the error correction fragments. Step 7516 then proceeds to step 7518.

Step 7518 determines whether the core quanta for the file has been stored in memory 120 (e.g. including the fragments recovered at step 7516). If not, step 7518 proceeds to step 7530. However, if all the core quanta is present, step 7518 proceeds to step 7520 to determine whether the file has now been marked for deletion. If so, step 7520 proceeds to step 7530. Otherwise, step 7520 proceeds to step 7522 to generate CRC data for the file. Then, at step 7524, the CRC data generated at step 7522 is compared with the CRC data stored in the header of the file. If the CRC data match, step 7524 proceeds to step 7526 to mark the file as completed, and truncates the erasure correction fragments for the file. Otherwise, step 7524 proceeds to step 7528 to mark the file for deletion. Both steps 7526 and 7528 proceed to step 7530.

Virtual Machine

The virtual machine (VM) 321 is a software module executed by the processor core 102 as a task, VM task 221, which runs applications stored in the flash file system. The VM is implemented as a byte-code interpreter that allows a single application to be run at any time, as the interpreter is single threaded. The VM may include, for example, two separate program counters and two separate stacks in order to run multiple applications. The use of byte-code allows the execution of applications from the data-flash memory that otherwise would not be able to be run by the processor 102.

A VM application is primarily event driven. It polls and acts on an event queue which accepts asynchronous events from user I/O (e.g. buttons), scheduled timer events, etc.

A particular application normally resides in a single identified file, as discussed below, but the interpreter supports call and return of functions in other files, which allows the application code to be maintained in a modular fashion, and thereby reducing file size downloads.

At any time there may be many application and data files resident in the flash file system. The following process determines what application to run and also manages the removal of redundant files.

Figure 9:
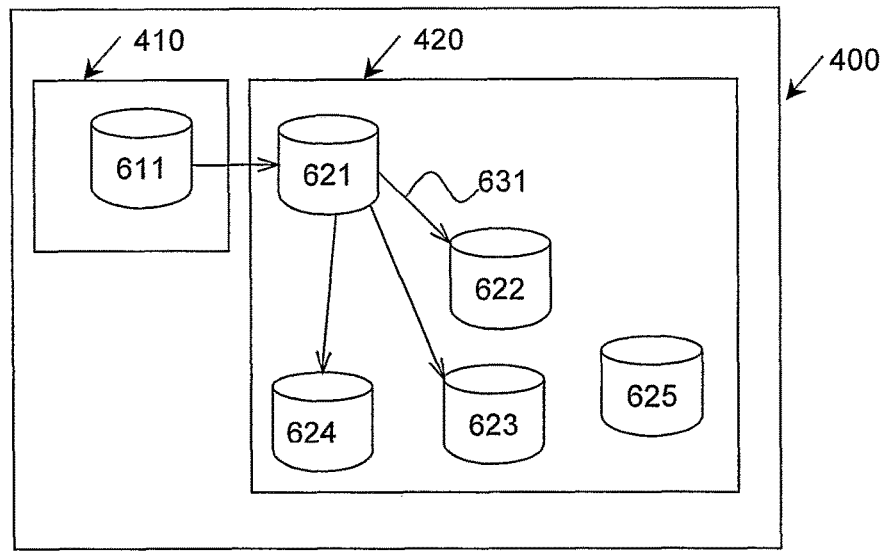
FIG. 9 is a block diagram of an application management system of the client processor device.

The VM 321 when started in the VM task 221 first attempts to run a file with name "0" (i.e. the "init" application 611, as shown in FIG. 9) typically stored in the write-protected area 410 of the flash file system 400. The init application 611 reads a configuration "init-tab" table file 621 which determines what file or files correspond to applications to be executed, the data files required for each application and the conditions under which the applications should each be executed (e.g. by using the pointers 631 to those files stored in the init-tab file 621). The init-tab file 621 is stored in the read-write area 420 so it can be regularly updated as the application and data files 622, 623, 624 stored in the flash memory 120 are updated. The init application 611 is also responsible for identifying and flagging files 625 that are candidates for deletion to help ensure the flash file system always has space for new files. Any files not identified in init-tab file 621 are delete candidates.

Event Application Data Files

TABLE 1

| | | |
|---|---|---|
| A | 12 | 2, 3, 7, 8, 9, 13 |
| ... | | |
| A | 6 | 2, 3, 5, 7, 8, 9, 10, 11 |
| A, B | 1 | 2, 3, 4, 5 |

Table 1 provides an example of the data in an init-tab file 621 which refers to three applications, respectively stored in files 12, 6 and 1. The first column identifies the events from the event queue that may be used to trigger the running of the application file in the second column. The last column determines data files required by each application.

The init-tab file 621, as shown in Table 1, states that an initial version of the application governing the operation of the device 100 was placed in file "1", and used data files 2, 3, 4 and 5. After some time, a new version of the application was produced with expanded functionality, and transmitted. This new version of the application used all files that original version used, with the addition of new data files 7, 8, 9, 10 and 11. The new version of the application was placed in file 6. Finally, the latest version of the application was created and transmitted to the device 100. The latest version of the application eliminated several of the old data files (4, 5, 10 and 11) and added new data file 13. The latest application file has been placed in file 12. The init-tab file 621 endeavours to run application file 12 if possible, otherwise application file 6 is run, or otherwise application file 1. An application file is only run if the init-tab file 621 is able to verify that all required data files for execution of a particular application file are available.

The init-tab file may also be structured to identify additional files for each event that need not be present to run the corresponding application, but must not be identified as delete candidates. This allows optional files to be present to be used by the application, if desired, without them being removed by the init application 611. If the space for new files or the number of free directory entries is below a certain threshold, file system resource may be recovered by removing one or more sets of files in init-tab corresponding to the lower priority events depending on the amount of resource to be recovered.

New data files 622, 623, 624 for an application may be received using receive process 1100 in FIG. 15, and once received, the files are locked by the application (e.g. by setting a read-lock flag corresponding to each file). Such locking prevents that application from using other data files which are not part of the current version being used by the application (e.g. files for a previous version). The application may use data files for a previous version by first unlocking the files for the current version being used, and then locking the files for the version selected for use.

The byte-code instructions of an application can be read into a small cache maintained in the RAM 108 to reduce the flash access overhead. The cache size being empirically set to balance cache load overhead with cache misses. The VM implements a data stack to store the local temporary variables and parameters. The design of the byte-code instructions used by the application files and interpreted by the VM are orthogonal to ease compiler design whilst minimising the number of instructions. They are grouped into 8-bit, 16-bit, 32-bit, floating-point groups and by number of operands for execution efficiency. A common set of operations is supported in all arithmetic groups (such as arithmetic, memory operations etc.), and additional operations may be supported for each group (e.g. bit tests for integers or for floating-point numbers etc.). Other operations, which are not part of the VM (such as trigonometric operations) are implemented, as desired, by function calls to specific files. Hardware or software resources are accessed using system calls, such as flash read/write. The function and system calls are executed using VM instructions involving unique function and system operational codes, respectively. A single operand is accepted to determine the operation to be performed, and any required parameters are passed via the data stack. The system calls are handled externally of the VM and this allows extensions that do not affect the core of the virtual machine. Calls to the flash file system, for example, allow directory information and file data information to be read.

An application can make a system call to the VM to reboot the device 100, if this is necessary for the application to now be run or take advantage of any new OS components sent to the device 100.

Air Protocol

The receiver 110 and the processor 102 utilise an air protocol to receive information including commands, time of day and file fragments. Information is transmitted using the air protocol by a server transmission system that has a server communications application to implement the air protocol and which can use an existing pager communications network infrastructure for transmission. The air task 214 controls communications between the processor 102 and the receiver 110. The air protocol is a communications protocol that, in accordance with the OSI layer model, has different attributes for a physical layer, a data link layer, a network layer and a transport layer The device 100 can use an existing communications network infrastructure to receive information, for example a paging network. Accordingly the link layer of the air protocol can be tailored to support transmission of text messages as defined by the Post Office Code Standardisation Advisory Group (POCSAG) standard.

The physical layer is simply the bit stream that is broadcast and received by the receiver 110. All the receivers 110 of different client devices 100 are normally tuned to the same carrier frequency for an application. This allows all of the client devices 100 to be updated with application files, as required. A unique ID or address for each device 100 (such as the serial number for the device 100), is available to filter the packets for an individual device 100. The device 100 is therefore identified by a paging address, and transmissions can be made for a number of paging addresses. The link layer supports a sub-set of the printable 7-bit characters, as discussed below.

The network layer supports the transmission of multicast packet data. The packets include address information to send the data to a single device address, a group of devices or all devices. A type parameter is used to identify the data carried, and the data types include commands, time and file segments, ie fragments. The network layer also enables data authentication and validation.

The transport layer supports the carriage of an arbitrary number of data octets of any length up to a maximum length supported by the link layer, which for the device 100 is 170 octets. The transport layer also provides error detection and optional correction so that corrupted packets can be identified and corrected.

For the transport layer, the data is pre-pended with its length in octets. The length is represented by an octet representing an unsigned 8-bit number. A CRC-32 is calculated from this and appended in little endian format as a quad-octet. The resulting message is then broken into quad-octets, padding with zeroes as necessary. Each quad-octet is converted to group of 5 ASCII characters using a base 85 encoding scheme, similar to RFC 1924, as discussed below.

The quad-octets are each treated as a little endian 32-bit unsigned number. To convert repeatedly they are divided by 85, taking the remainders at each step. The 5 remainders are placed in little endian order. They are each mapped to a printable character by using a mapping scheme that has monotonically increasing values, which allows for simpler decoding (ie without using a look-up table).

The resulting ASCII message is then padded out to a multiple of 20 characters by padding with '}'. A '}' is used because a group of 5 is an illegal BASE-85 encoding. This is to ensure that the message occupies a complete number of POC SAG codewords (each contains 20-bits, 20 characters=7 codewords). The group is encoded also using the base 85 encoding scheme.

For the network layer, an air protocol packet has the following structure:

```
<packet> ::= <Protocol Id><payload>
<Protocol Id> : := <octet>
```

<payload> depends on <protocol Id> which designates the protocol type.

Protocol Id has a value that identifies the protocol as follows.

<Protocol Id>=1 allows sending of a data of a specified type. This can be sent to specified processors by the parameter <Processors> if the device 100 has more than one processor 102. More than one processor may be included in the device 100 in situations where a GPS receiver of the device 100 has a processor that is considered to be a separate processor for which files may need to be downloaded. Alternatively, an additional processor 102 may be included to be dedicated to a particular OS task to enhance the cycle time for that task and in turn enhance the speed of the device 100. Then

```
<payload>::=<Address><Processors><Type><Data>
```

<Protocol Id>=2 allows transmission of a specified data type to specified processors in a group of devices with a timestamp.

<payload>::=<Address><Processors><Type><Time stamp><Data>

<Protocol Id>=3 allows transmission of authenticated data to specified processors with specified type to a group of devices with a timestamp.

<payload> : : = <Address><Processors><Type><Time stamp><Authentication><Data>

<Protocol Id>=4 allows transmission of a specified data type to specified processors in a group of devices with a timestamp and a local time offset.

<payload> :: =<Address><Processors><type><Time stampXLocal time offset><Data>

<Protocol Id>=5 allows transmission of specified data type to a set of units in a specified product and platform range with timestamp and local time offset.

<payload>::=<Product Id><Platform_range><Address><Type><Data>

<Protocol Id>=6 allows transmission of specified data type to a set of units in a specified product and platform range with timestamp.

<payload> :: = <Product Id><Platform_range><Address><Type><Time stamp><Data>

<Protocol Id>=7 allows transmission of specified data type to a set of units in a specified product and platform range with timestamp and authentication.

<payload> :: = <Product Id><Platform_range><Address><Type><Time stamp><Authentication><Data>

<Protocol Id>=8 allows transmission of specified data type to a set of units in a specified product and platform range with timestamp and local time offset.

<payload> :: = <Product Id><Platform_range><Address><type><Time stampxLocal time offset><Data>

For Product Id:
The product Id allows the particular pager address (cap code) to support multiple products by identifying which product should receive the packet:

<Product Id>=<octet>

For platform range:
The platform range determines what releases of the platform should receive the packet by means of a range of acceptable platform build numbers:

<Platform_range> :: = <platform_min><platform_max>
<platform_min>,<platform_max> = <platform> = <octet_LSB><octet_MSB>

For addressing:

<address> :: = <broadcast>|<group>|<serial> = <octet><octet><octet><octet>
<broadcast> ::= OxFF, OxFF, OxFF, OxFF
<group> :: = OxFF,OxFF, <group Id>
<group Id> ::= <octet_LSB><octet_MSB> = 0x0000 .. OxFFFE
<serial> :: = <octet_LSB><octet><octet><octet_MSB>

Specifies all devices, a particular device or a group of devices.

<Processors>::=<octet>=<processor1:lsb> . . . <processor8:msb>

Specifies a set of processors from a maximum of 8.
Message types specifies how the system should handle the data being transmitted:

<type> ::= <octet> = <file fragment> | <set time> | <set groups> | <user data> | <user alarm>
<file fragment> ::= 1
<set time> ::= 2
<set groups> ::=3 <user data>:: = 4
<user alarm> :: = 5

The actual message data transmitted:

<data> :: = {<octet>} | <file fragment> | <set time> | < set groups> | <user data> | <user alarm>

For a file fragment sent to a specified memory:

<file fragment> ::= <header>{<byte>}
<header> ::= <CRC32><date><length><data><erasure><number><access><name><size><count><correction>
  <CRC32> ::= <LSB:octet><octet><octet>< MSB:octet> = CRC32 of core file
contents
  <date> ::= <time> = Release date
  <length> ::= <LSB:octet><octet><octet>< MSB:octet> = file length in bytes
  <data> ::= <LSB:octet ><MSB:octet > = length of all data quanta and erasure
correction quanta in bytes
  <erasure> ::= <LSB:octet ><MSB:octet > = length of all erasure correction
quanta only
  <number> ::= <LSB:octet ><MSB:octet > = first quanta number in this fragment
  <access> ::= <section:LSN><storage:MSN>
  <name> ::= <byte> = filename
  <size> ::= <byte> = quanta size
  <count> ::= <byte> = quanta count
  <correction> ::= <nibble:E><nibble:c> = erasure correction, E = k and c = n-k
  <section> ::= <FLASH_RO> | <FLASH_RW> = flash section type
    <FLASH_RW> ::= 0 = Read/write section
    <FLASH_RO> ::= 1 = Read only section
  <storage> ::= 0 .. 15 = memory id to store fragment The parameter set groups allow up to eight group addresses to be set for a device 100 identified by its 10, ie its serial number.

```
<set groups> ::= <group1:group> .. <group8:group>
<group> : := <LSB :octet ><MSB :octet>
```

The parameter set time sets time using a previous time reference to reduce error.

```
<set time> ::= <time referencextime correctionXLocal time offset>
<time reference> := <time>, previous timestamp in payload
<time correction> ::= <octet> = 0 .. 240 (seconds = 4 minutes)
```

The format of user data

```
<user data> ::= {<offset><length><data>}
    <offset> ::= 16 bit unsigned
    <length> : := 16 bit unsigned
    <data> ::= <length> octets.
```

For user alarms to be set:

```
<user alarm> ::= {<set ualarm> | <cancel ualarm>}
    <set ualarm> ::= 'S'<ualarm numberxualarm record>
    <cancel ualarm> ::= 'C <ualarm number>
    <ualarm number> ::= <octet> = 0 .. 3
    (device may use less than this)
```

A <ualarm record> is large enough for 4 <time>s however only 2 are defined:
And the rest may or may not be used for <time>s in the future, they may be just data.

```
<ualarm record> ::= <ualarm timexualarm
usebyXualarm Oxualarm 0>
    <ualarm time> ::= <time> (the alarm is to go off)
    <ualarm useby> ::= <time> (the time the alarm
    is not to be attempted after)
    <ualarm 0> ::= a zero of number of octets in <time>.
```

The time format, which defines days, minutes, seconds since 1 Jan. 2000, GMT is:

```
<time> ::= <octet LSB><octet><octet><octet MSB>
    = <ddddddddddddddddmmmmmmmmmmmnimssssss>
``` days most significant 15 bits, minutes next 11 bits, seconds least significant 6 bits

```
<Time stamp> ::= <time>
<Local time offset> ::= <octet>
``` specifies signed difference in half-hour increments between local and UTC time. E.g. 20=+10 hours To supply an authentication keyword:

```
<authentication>::
    =<octet_LSB><octet><octet><octet MSB>
```

Command Processor

The command processor task 222 and associated module 322 implements a command line interface for a computer attached via the asynchronous serial interface 115.

For example a "LS" command would produce, as shown in the example Listing 1 below, first a header output and then a listing of the files of the device 100 written out one file per line. The fields in the lines correspond to the fields in the header, and what each field means is described in Table 2 below:

TABLE 2

| Field | Description |
|---|---|
| Na | Directory name, the name in the directory written out as <byte2> since the file may be incomplete and so that is not printable. |
| N | Name of the file written as a <graphicchar>. If the name is not a graphic char then the "~" is written instead so that the columns stay correctly spaced. Not "~" is 0xxx so it may actually be the name of the file. |
| DN | Directory number of the file written out in <byte8>. |
| TY | File type written out in <byte8>. |
| Length | This is the length of the file in bytes and the value is written out in <byte8>. |
| CRC32 | This is the CRC32 (32 bit CRC) of the file and its value is written out as <byte8>. |
| R Date | This is the Release Data of the file written out in <time>. |
| C Date | This is the Create Date of the file written out in <time>. |
| DQ | The number of Data Quanta for the file in <byte4>. |
| EQ | The number of Erasure Quanta for the file in <byte4>. |
| QS | The Quanta Size for the file in <byte2>. |
| QC | The Quanta Count for the file in <byte2>. |
| EC | The Erasure Correction byte for the file in <byte2>. |
| A | The Access for the file written as a <char>. A "W" means it is read and writeable on the media "R" means that it is read only on the media. |
| FG | The flag byte which flags various information about the file. The value is written out as <byte2> and the value is the sum of various flags. Their values are: Deleted: 0x01 Incomplete: 0x02 Complete: 0x04 Released: 0x08 Locked: 0x10 Open: 0x20 |

An example file listing is shown below in Listing 1:

LISTING 1

| Na | N | DN | TY | Length | CRC32 | R_Date | C_Date | DQ | EQ | QS | QC | EC | A | FG |
|---|---|---|---|---|---|---|---|---|---|---|---|---|---|---|
| | | | | | | >1s | | | | | | | | |
| 51 | Q | 00 | 00 | 000004E6 | 12B0DD16 | 0F922003 | 0F926EC0 | 000A | 0000 | 80 | 01 | 10 | W | 38 |
| 4D | M | 01 | 00 | 00002A4C | D2E930D3 | 0F921FDC | 0F926E95 | 0055 | 0000 | 80 | 01 | 10 | W | 38 |

LISTING 1-continued

| Na | N | DN | TY | Length | CRC32 | R_Date | C_Date | DQ | EQ | QS | QC | EC | A | FG |
|----|---|----|----|--------|-------|--------|--------|----|----|----|----|----|---|----|
| 00 | ~ | 02 | 00 | 000004F6 | FD16F9E8 | 0F92689E | 0F926E91 | 000A | 0000 | 80 | 01 | 10 | W | 08 |
| 31 | 1 | 03 | 00 | 0000695D | 76BED359 | 0F92689E | 0F926E28 | 00D3 | 0000 | 80 | 01 | 10 | W | 38 |
| 32 | 2 | 04 | 00 | 00006D08 | CD49541C | 0F92689E | 0F926DC0 | 00DB | 0000 | 80 | 01 | 10 | W | 08 |
| 33 | 3 | 05 | 00 | 0000736A | 23BCF15C | 0F92689E | 0F926D4E | 00E7 | 0000 | 80 | 01 | 10 | W | 08 |
| 3A | : | 06 | 00 | 00000B4B | 44658709 | 0F92689E | 0F926D43 | 0017 | 0000 | 80 | 01 | 10 | W | 38 |
| 40 | @ | 07 | 00 | 0000001E | 7A09C6EA | 0F92689E | 0F926D43 | 0001 | 0000 | 80 | 01 | 10 | W | 18 |
| 41 | A | 08 | 00 | 00002A0C | 5BEC9718 | 0F92689E | 0F926D18 | 0055 | 0000 | 80 | 01 | 10 | W | 08 |
| 5F | — | 09 | 00 | 00000001 | D202EF8D | 0F92689E | 0F926D17 | 0001 | 0000 | 80 | 01 | 10 | W | 18 |
| 4B | K | 0A | 00 | 0000EA60 | 944B18FD | 0F9261E0 | 0F94681AE | 01D5 | 0000 | 80 | 01 | 10 | W | 02 |
| | | | | | | >>1s Q | | | | | | | | |
| 51 | Q | 00 | 00 | 000004E6 | 12B0DD16 | 0F922003 | 0F926EC0 | 000A | 0000 | 80 | 01 | 10 | W | 38 |

2. Transmission System Infrastructure 2.1 File Transmission

The files to be transmitted to the device 100 are each first broken up into a size that can be encapsulated by the air protocol and sent using a server transmission system, described below and shown in FIG. 23. The file fragments produced in accordance with the air protocol can also be transmitted to the device 100 using a remote relay unit (RRU) 1900, as described below and shown in FIG. 22.

Figure 10:
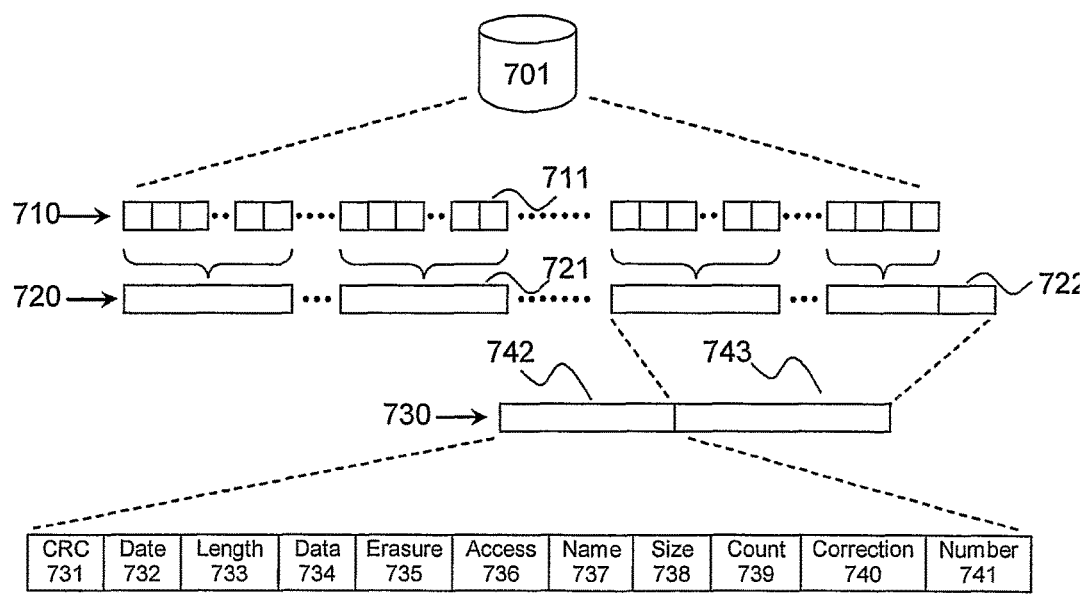
FIG. 10 is a block diagram of a file transmission system of the client processor device.

The file to be transmitted 701, as shown in FIG. 10, is treated as an arbitrary sequence of bytes, 710, up to the limit supported by the flash file system described above. Each byte, 711 is an 8-bit binary value. Consecutive sequences of bytes 721 are assembled into equal length groups of quanta 720. The last quanta 722 to be transmitted is padded with zeros, as required, to ensure that the last quanta 722 has the same size as the other quanta (e.g. 720) being transmitted. Quanta are all equal length for a particular file and are numbered consecutively starting at zero.

A file fragment 730 suitable for transmission consists of a header 742 followed by data 743. The data is a sequence of quanta 720. The data in the last fragment is padded with zeros as required.

The header 742 contains information related to the data 743 in a file fragment 730, and consists of a number of parameters (described as follows) transmitted in little endian order for compatibility with the representation used by the firmware compiler 2002. Each header 742 starts with a 32-bit cyclic redundancy check 731 calculated for the data 743 contained in the file fragment 730. This is followed by a 32-bit date/time stamp 732 for the file 701 in the format described in the air protocol section above, and a 32-bit length 733 representing the total length of the file 701 (e.g. in bytes), both of which may be derived from the file's 701 directory information. This is followed with a 16-bit count of the total number of data quanta 734 required to send the whole file 701 (i.e the core data quanta, or the data corresponding to the actual data in the file 701), and the total number of erasure correction quanta 735 generated for the file 701, as described below. A 16-bit quanta number 736 identifies the number assigned to the data quanta that first appears in the current file fragment 730 being transmitted. If the quanta number 736 in the current file fragment 730 is greater than the number of data quanta required to send the whole file 701 (i.e. as represented by 734), then the data 743 in the fragment 730 is erasure correction data. An 8-bit access field 736 determines if the file 701 is to be placed into read/write 420 or write-protected 410 section of the file flash system 400, based on the value represented by the access field 737 (e.g. as "0" for read/write access and "1" for write-protected access). Files (e.g. 701) are given a single 8-bit name 737 (e.g. an 8-bit binary number) of which typically the last 255 values represented by the 8-bits are available for use. The number of bytes per quanta size and the number of quanta per fragment are represented by 8-bit values 738 and 739, respectively. The correction information 741 represents an 8-bit value and identifies the level of erasure correction used, the nibbles at the upper and/or lower nibble locations, representing as k and n-k respectively (where k is an integer with a predetermined value and n is the total number of fragments in the group). For a particular file all parameters in the header are held constant with exception of the quanta number 736 which corresponds to the file location of the data being transmitted.

File fragments may be transmitted in any order and there is a benefit to be gained by interleaving fragments to improve system performance if a number of consecutive fragments are lost by the transmission system. The system also allows a file fragment to be transmitted repetitively to increase the probability the complete file is received.

If desired, erasure correction fragments (ECFs) can be additionally generated from the fragments derived from the file data. ECFs allows lost file fragments to be recovered more efficiently than relying on multiple transmissions of the sample fragment. This redundancy greatly improves reception performance under adverse signal conditions. The level of redundancy is set on a file by file basis depending on the reliability desired based on transmission loss, number of fragments, etc.

Figure 11:
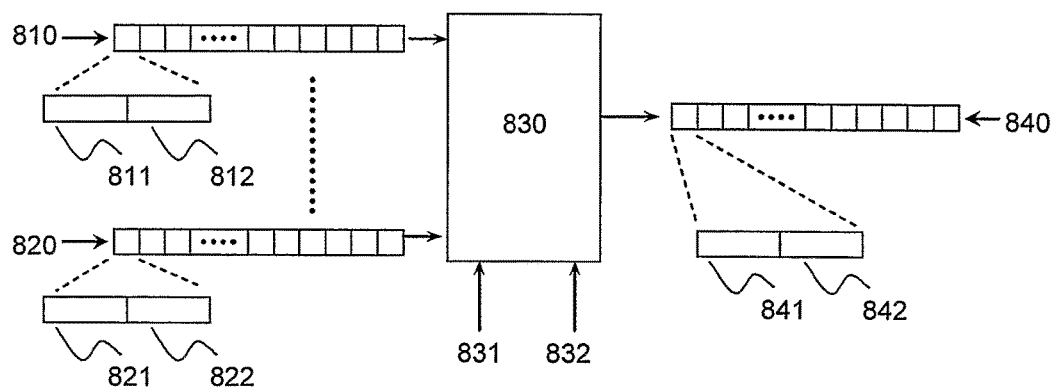
FIG. 11 is a block diagram of an erasure correction fragment generation process of the client processor device.

FIG. 11 is a schematic diagram showing how erasure correction fragments are generated.

A set of k consecutive fragments (e.g. 810, 820), are used to generate one or more (ie n-k) erasure correction fragments 840 using an ECF process performed by an ECF module 830.

In addition to the data in the sets of fragments 810, 820 received by the module 830, the module 830 accepts further input for determining the number of k groups of fragments 831 in each set and the desired number of erasure correction fragments 832 to be generated based on the groups of fragments in each set. The size of the erasure correction fragment 840 is the same size as the original fragments as received by the ECF module 830.

The ECF module 830 generates the desired erasure correction fragment using finite field arithmetic on a nibble-by-nibble basis. For example, lower nibbles from the same locations from each of the original fragments in each set (e.g. nibbles 811 to 821) are each used to generate a single corresponding erasure correction nibble (e.g. 841). Similarly, the upper nibbles at locations (e.g. 812 to 822) are used to generate a corresponding upper erasure correction nibble (e.g, 842). A field size of 16 is therefore sufficient and means an efficient implementation of the finite field arithmetic using 8-bit arithmetic natively supported by the processor 150.

Figure 12:
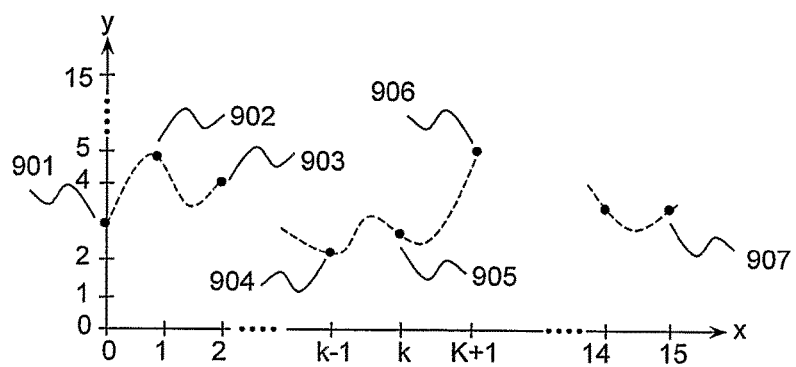
FIG. 12 is a block diagram of a Lagrange polynomial interpolation process of the client processor device.

The ECF process may use a Lagrange polynomial function to generate erasure correction data. For example, each integer value of x (along the x-axis, as shown in FIG. 12) corresponds to a nibble in their order of appearance in each set (e.g. 811 to 821). The value on the y-axis of FIG. 12 at each x-location corresponds to a numeric value represented by each nibble respectively. The polynomial coefficients of the Lagrange function are determined such that the function uses the data values of the nibbles at their equivalent x-locations 901, 902, 903, 904, as depicted in FIG. 12 (i.e. the coefficients define an approximated function that passes through the y-axis value corresponding to each x-location 901, 902, 903, 904, etc.). The erasure correction data may also be generated by evaluating the polynomial at other points 905, 906, 907 as required. The finite field arithmetic limits the sum of the number of erasure correction fragments and original fragments to less or equal to 16.

In the client processor device 100, the Lagrange polynomial interpolation may be used in a similar fashion to retrieve any missing fragments provided that at least a unique k (as defined by the correction information 741) of the original number of n transmitted file fragments 730 have been received.

2.2 Web Server System

A user is able to control one or more client devices 100, and these can be allocated to an identified group using a group Id, as discussed above for the air protocol.

A web server system 1005, as discussed below, is provided for users to access and enable them to:
(i) Create a group;
(ii) Change a group's details;
(iii) Change devices in a group;
(iv) Remove a group;
(v) Configure a group of devices 100;
(vi) Display data received from one or more devices 100.

2.3 Transmission System

Figure 23:
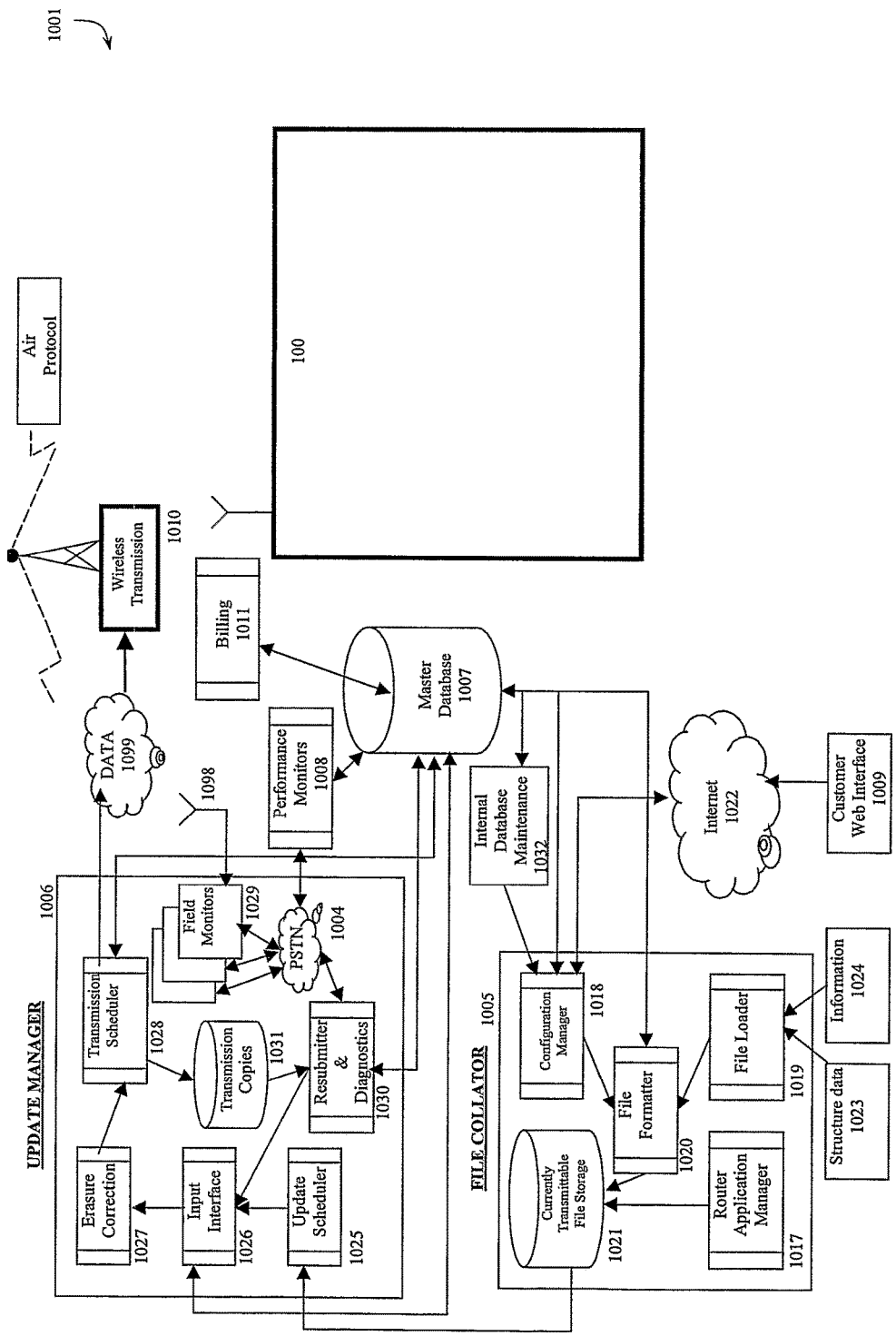
FIG. 23 is a block diagram of a server transmission system for communicating with the client processor device.

The infrastructure includes a server transmission system, as shown in FIG. 23, having a file collator 1005, an update manager 1006, a master database 1007, performance monitor 1008 and a wireless transmission apparatus 1010. The server transmission system also provides a customer web interface 1009 via a web server provided by the file collator 1005.

The file collator 1005 (or central transmission server) loads and maintains information that controls the operation of the device 100, and to create and store instruction and data files used by that device. The data is stored in a relational database 1007, and data file suitable for transmission to the device are created by a file formatter 1020 and kept on disk in a currently transmittable file storage database 1021 from where they can be retrieved by an update scheduler 1025 as required. Instruction files used by the device 100 are also stored in the currently transmittable file storage database 1021. The file collator 1005 includes a router application manager 1017, a configuration manager 1018, a file loader 1019 and a file formatter 1020, in addition to the currently transmittable files storage database 1021.

The master database 1007 interfaces with a billing module 1011, which enables the data files for transmission to the devices to be updated with a range of billing data. For example, the master database 1007 may retrieve call tariff rates for different carriers, carrier rate structure (e.g. peak and off peak rates), carrier billing data and customer billing data via the billing module 1011 for storage in the master database 1007.

The router application manager 1017 generates files for transmission to the device 100. Modifications to the manner in which a task is performed by the device 100 are achieved by sending a new version of the relevant file to the device 100. The file is written directly to the current transmittable file storage database 1021 from the file formatter 1020. From this database 1021, the update scheduler 1025 forming part of the update manager 1006, retrieves the file for transmission at an appropriate time.

The configuration manager 1018 enables manual changes to be made to the information maintained in the master database 1007. The configuration manager 1018 includes a number of screen layouts that can be used to review and change a different section of the database 1007. Each user of the system is issued a user name and password that determines which screen the user can access. Screens that are used to maintain a particular client's information are accessible only to that client, using the Internet 1022, and a suitable web browser constituting the customer web interface 1009, and authorised company personnel. The configuration manager 1018 also interfaces with the internal database maintenance module 1032, which maintains the consistency of the data in the master database 1007 and may provide the configuration manager 1018 with an updated view of the database 1007.

The configuration manager 1018 includes two sub modules (not shown in FIG. 23), namely a transmission manager and a client web interface. The transmission manager enables user control of the schedule for transmission of files maintained in the currently transmittable file storage database 1021 to the device 100. Files can be transmitted regularly either at a set interval or at a specific day and/or time, or a file can be transmitted on a one off basis. Files can be assigned a priority when transmitted. The client web interface enables users to maintain personal information and device configuration information, as discussed previously.

The file loader 1019 provides a consistent process by which data contained in externally sourced files is loaded into the master database 1007 (via file formatter 1020), and is tested and released to production in a controlled manner. Given the differing nature of the various files that need to be loaded, the file loader 1019 is modular in nature so that each type of file can be handled individually when necessary, whilst assuring the same overall process is followed. Externally sourced files, such as structure data files 1023, and external entity information files 1024, are shown in FIG. 23, and may be provided by an infrastructure provider or service provider. The information files may include costing information and other data.

The file loader 1019 ensures that the following steps are undertaken during the loading of a file:
(1) Parsing. Errors in file formats are detected and handled.
(2) Preliminary load. The data is first loaded into a "staging" area within the database so that it can be verified.
(3) Redundancy checks. New data is compared against data maintained in the master database 1007, if there is no difference, the new data is discarded. If differences are found however, the nature of the differences are gauged so that appropriate levels of testing can be performed.
(4) Testing. The new data is tested in an appropriate fashion.
(5) Approval. Authorised personnel check the results of the previous stages and approve, or not, the new data as suitable for production.

(6) Release. The new data is released to production and the file formatter 1020 is instructed to regenerate the affected files in the current transmittable file storage database 1021. This typically involves scheduling one or more files for transmission to devices 100, depending upon the importance of the new data.

The file formatter 1020 provides a consistent framework for the generation of files that are required for operation of the device 100. Similar to the file loader 1019, the file formatter 1020 provides a consistent structure for the files whilst still allowing for the individual requirements of each type of file. The file formatter 1020 places the generated files in the current transmittable file storage database 1021 where the files are accessible by the process responsible for initiating the transmission of the files (e.g. the update scheduler 1025). The current transmittable file storage database 1021 forms part of the directory hierarchy on a main server's disk which is accessible to all processes involved in the generation and transmission of files, namely the router application manager 1017, the file formatter 1020, and the customer web interface 1009.

The update manager 1006 selects the appropriate transmissions medium, controls the packaging of data and schedule delivery of the data (via the selected transmission medium) to the wireless transmission apparatus 1010 and/or the Remote Relay Unit (RRU) 1900, for subsequent delivery to the device 100. The update manager includes an update scheduler 1025, an input interface 1026, and an erasure correction routine 1027, a transmission scheduler 1028, in-field monitors 1029, and a re-submitter and diagnostics system 1030, in addition to a transmission copies database 1031. The update scheduler 1025 is a software process that runs continuously reading the master database 1007 to retrieve the schedule for file transmission and sending requests to the input interface 1026 as required. The input interface 1026 is an executable program that extracts prioritised and formatted data from the current transmittable file storage database 1021. This data is passed directly through to the erasure correction routing 1027. As data is passed through this routine, it is prefixed with the appropriate device header information.

The erasure correction routine 1027 transforms the input data into a number of redundant blocks (or error correction fragments) that improve the reliability of reconstruction of the original data, provided a given number of the redundant blocks are received unchanged by the device 100. The redundant blocks may be generated using the process described above in relation to FIGS. 11 and 12. The redundant blocks are packaged and sent to the transmission scheduler 1028 individually. The transmission scheduler 1028 selects the appropriate medium for transmission (e.g. a wireless network used by the wireless transmission apparatus 1010). The transmission scheduler 1028 receives and stores packets passed from the erasure correction routine 1027, and periodically forwards the highest priority data packets to, for example, the wireless transmission apparatus 1010 for transmission via the selected transmission medium (e.g. a wireless network). A copy of the packets sent to the wireless transmission apparatus 1010 is written into the transmission copies database 1031 and removed from storage. The in-field monitors 1029 are modified versions of the client device 100, with modems attached to a dedicated link to, for example, the PSTN network. These monitors receive all data transmissions to the devices 100 in their locality. This data is forwarded to the resubmitted and diagnostics system 1030 via the PSTN network.

The resubmitter and diagnostics system 1030 includes multiple input lines from the PSTN network 1004, and executes a comparison process per input line and a single resubmit process. The comparison process for each input line compares data received by the corresponding in-field monitor 1029 with data written to the transmission copies database by the transmission scheduler 1028. The resubmit process performed by the resubmitter and diagnostics system 1030 periodically reviews the comparison results and resubmits to the input interface 1026 any packets or files as required. The in-field monitors 1029 also transmit information for the purpose of assessing the performance of the selected transmission medium/network (e.g. by transmitting data via antennas 1098). All information of this nature is stored in the master database 1007 for analysis. The information is used on an ongoing basis to ensure that the selected transmission medium/network performs at a required specification.

The file loader 1019 and configuration manager 1018 maintain the information stored in the master database 1007. The file loader 1019 performs routine loading of data contained in files with known formats. The configuration manager 1018 is used for manual entry of data that is not available in files, and for manual adjustment of other data as required via an internal database maintenance module 1032.

The performance monitor 1008 is a group of processors that monitor the operation of the support systems on a day to day basis. The performance monitor 1008 provides a means of visual inspection of resource usage levels, as well as standard reports at periodic intervals. It also issues warnings when the system becomes overloaded in any way. Components that are monitored in this way include:

(1) Files transmission. The number of errors and hence retransmissions are monitored to determine transmission quality in the various areas covered by the network.
(2) Database host. System resources on the database hose machine(s) such as CPU, disk and memory are monitored to ensure performance targets are met.
(3) Database server. Inbuilt capabilities of the database service software are used to ensure that the database is running efficiently.
(4) Web host. System resources on the web-server host machine(s) such as CPUs disk and memory are monitored to ensure performance targets are met.
(5) Web server. The inbuilt capabilities of web server software are used to ensure that the database is running efficiently.

The wireless transmission apparatus 1010 uses the air protocol and enables information to be efficiently distributed from a central location to a large number of devices 100 using, for example, the existing pager communication network.

2.4 The Remote Relay unit (RR U)

Figure 22:
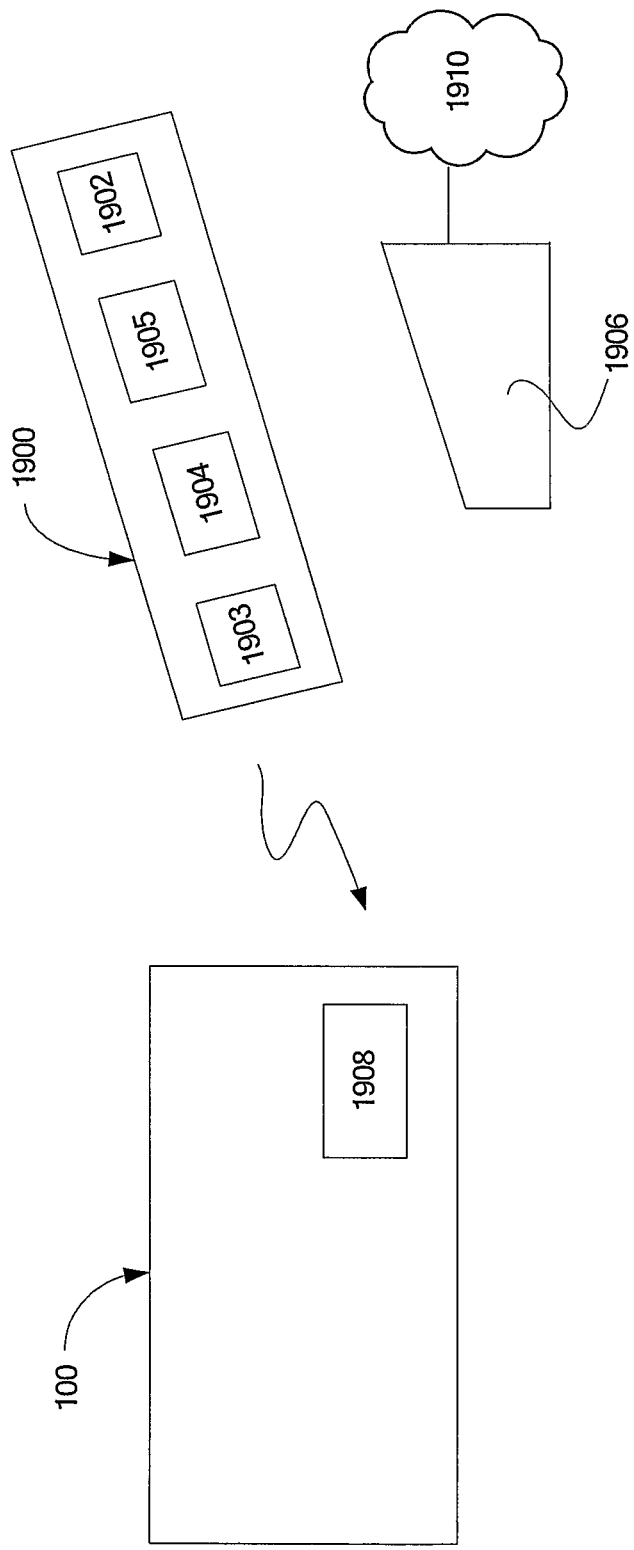
FIG. 22 is a block diagram of a remote relay unit for communicating with the client processor device.

The remote relay unit 1900, as shown in FIG. 22, is a handheld device that can be used by service personnel or a user of the device 100 to transmit file fragments to the device 100. The RRU 1900 is particularly useful in situations where the wireless communications network, eg the pager network, is unable to communicate with the device 100, for example if coverage of the network does not extend to the location of the device 100. The RRU 1900 is able to obtain the file fragments from the update manager 1006 using online connection methods, or by direct connection, to the transmission system 1910 (e.g. via the data network 1099 as shown in FIG. 23). Once the RRU has received the file fragments, the fragments can be sent to the device 100 using a short range wireless communications protocol, such as Bluetooth or ZigBee (http://www.zigbee.org. or an infrared protocol, such as one that complies with the standards of the Infrared Data Association (IrDA) (http://www.irda.org) One RRU 1900 may be used to communicate and configure a number of devices 100. The RRU 1900 may also be used to program and/or control other items in a user's household, such a VCR, DVD, TV, lights etc, either autonomously or by user intervention. The control of these items, together with the devices 100, can be based on data dynamically available and updated from the central transmission system 1910. The data and file fragments can be delivered to the RRU 1900 based on user preferences stored as part of the transmission system, or based on direct instructions from the user, eg by interrogating the transmission system over the Internet.

The RRU 1900 is also configured to enable information to be extracted from local units, such as the household items and the devices 100, so as to obtain diagnostic status, statistic and event log data. A wireless interface, such as an IrDA or ZigBee interface, can be used for retrieval of the information, but again may be under the direct control of the user or performed autonomously when a connection can be established. Information retrieved from the local unit is stored on the RRU 1900 and then made available to be sent to the central transmission system 1910 or for upload to a user's computer device, e.g. personal computer system or PDA. The computer device is able to access the RRU 1900 using an IP connection.

The RRU 1900 includes a communications module 1902 that enables the RRU 1900 to connect to the transmission system using at least one of the following: GPRS; CMDA-IX; Ethernet; WLAN; or IP Dial-up. The connection normally would be always online. If not, the connection is either established by either the central server 1005 or the RRU 1900 on demand. The central server 1005 would typically use the IP based protocols for connection, but a simplex download connection to the RRU 1900 would suffice.

The RRU 1900 includes a flash file system 1904 that allows information to be received locally in addition to being downloaded from the central server transmission system 1005.

The file system 1904 is scaled appropriately to cater for the number and size of files required. The size of this file system 1904 may directly relate to the number of local units 100 associated with it.

The RRU 1900 has a second communications module 1903 to allow information to be distributed to its associated local units, ie the devices 100, and support retrieval of information from the local units. The second module 1903 provides the wireless communications interfaces, such as ZigBee, IrDA, and/or pager (POCSAG) interface.

The RRU 1900 has a microcontroller system 1905 that maintains a real-time clock for synchronising the time in the associated local units when required. The clock is set using a network time protocol from the server transmission system 1005. The system 1905 includes a user display that can be used to show status information and to facilitate the user interface. The system 1905 also has buttons and/or a keypad to provide user interaction/control.

A RRU 1900 can be associated with a number of user local units that include third-party consumer devices (e.g. VCRs, TVs) in addition to the client processor devices 100. The user registers the make and model number of each of the consumer devices on the central server transmission system 1005 via the web interface 1009. Depending on support for the third party devices, configuration information is generated on the central server 1005 and sent to the RRU 1900 to allow the devices to be controlled. The serial number of each of the client processor devices 100 is similarly registered on the web interface 1009. The central server 1005 controls the number and type of associated devices 100 depending on the resources (power, memory and communications bandwidth) associated with the remote relay unit 1900. A particular device 100 is normally associated with a single remote relay unit 1900.

In order that a relay unit 1900 can communicate with a particular device 100 it may, depending on the transmission method, need to be in the vicinity or close line-of-sight of the device. This means the RRU 1900 is normally a portable device similar to a mobile phone. It is returned to a cradle 1906 to recharge and/or make a wired connection to server transmission system 1005, if required.

In order that the client processor devices 100 can communicate with the relay unit 1900, they are provided with the I/O module 130. This provides a corresponding communications interface 1908, such as ZigBee or IrDA. These interfaces support relatively high-speed bidirectional communication and this ensures that the data is transferred in a reliable and timely manner. The device 100 monitors the alternate interface 1908 and communications over this interface 1908 would normally override that received on the pager receiver 110.

After the RRU 1900 and associated local units are registered, the file system 1904 is then able to accept updates from the central server 1005. The user may chose to make changes (i.e. configuration or otherwise) using the web interface 1009 or new data may be available from the server 1005 depending on the service(s) the user is subscribed to. Subscription data indicating the services subscribed by a user may be maintained, for example, on the central server 1005. If new data is available the central transmission server 1005 checks the online status of user's the RRU 1900 and indicates this status to the user during the time the user is using the web interface. Once the changes are sufficiently completed the server 1005 attempts to download the data to the remote unit 1900. Once the data is fully downloaded, the RRU 1900 indicates this as fresh data available (e.g. as a flashing light or textual display) and then proceeds to automatically transfer the data to the associated local units. If the RRU 1900 cannot be contacted from the server 1005, the user needs to take action such as manually starting the connection by returning the RRU 1900 to the cradle 1906. If the RRU 1900 has data for an associated client processor device 100 but cannot connect to it, the user is instructed to take appropriate action (i.e. to bring the remote relay unit 1900 to the client processor device 100). The client processor device 100 may similarly indicate that it has received fresh data (e.g. by flashing a light).

3. Meter Device With Remote Updating and Configuration

A metering system 1001 allows the functionality of meters to be automatically modified or updated as the requirements of the customer and/or supplier change over time. The metering system 1001 comprises the server transmission system, as described previously with reference to FIG. 23, and includes a file collator 1005, an update manager 1006, a master database 1007, performance monitor 1008 and a wireless transmission apparatus 1010. The server transmission system also provides a customer web interface 1009. The metering system 1001 includes a client processor device 100 configured to have a hardware architecture 1002 and logic architecture 2500 for monitoring and/or controlling one or more different meters. The client processor device 1002 may be integrated as part of the meter, or may be a separate device external to the meter.

The client processor device 1002 receives upgrades in the form of files transmitted via the server transmission system. The files can include application, data or firmware files which enables the client device 1002 to be reconfigured for provide new functionality (e.g. the ability to communicate with different meters or other hardware components in meters). The received files are transmitted and will be processed by the device 1002, as described previously for the client processor device 100.

Figure 24:
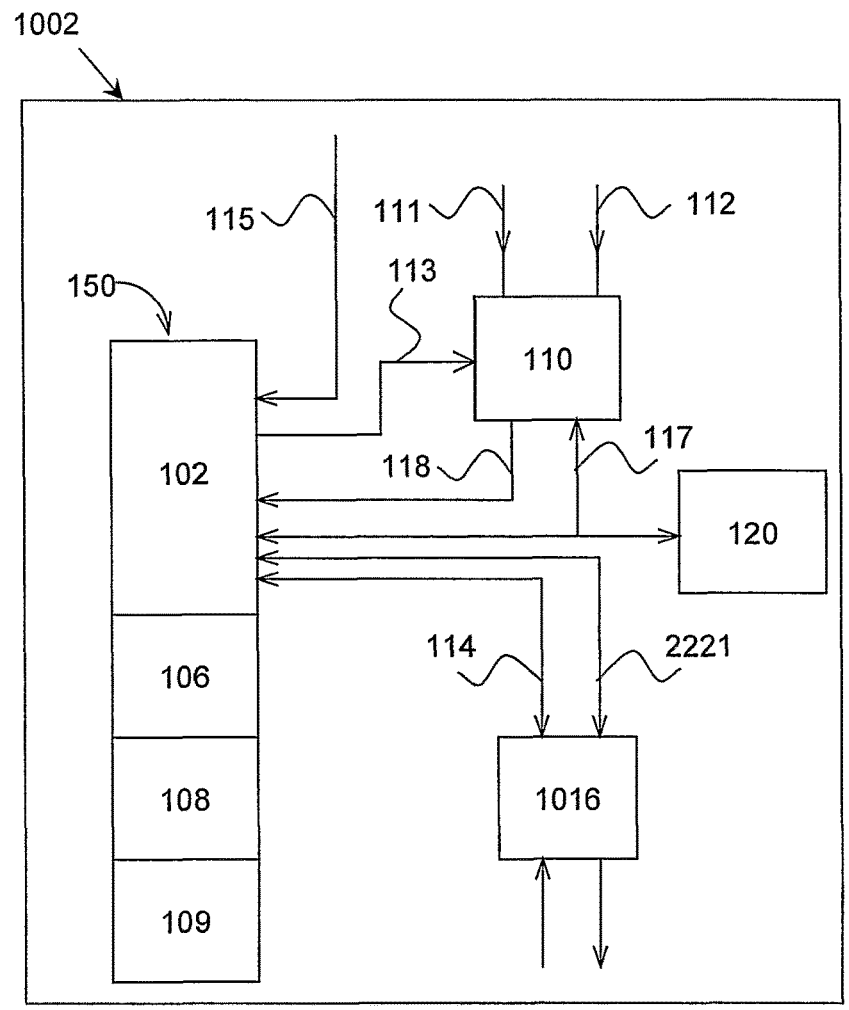
FIG. 24 is a block diagram of a client processor for a metering application

FIG. 24 shows the internal components of the client processor device 1002 for controlling a meter. The device 1002 includes a control interface 1016, which communicates with the processor core 102 of the microcontroller 150 on both the data and address bus 114 and the control bus 2221. The control interface 1016 receives control signals generated by the processor core 102 from the control bus 2221, which triggers the line interface 1016 to send or receive data via the data and address bus 114. The client processor device 1002 may also include a visual display (not shown in FIG. 24) for displaying status or control information to a user (e.g. usage statistics read from various meters or status information of different meters). The display communicates with the processor core 102 via the data and address bus 114. The control interface 1016 also interfaces with hardware components of a meter, such as components for controlling the provisioning (e.g. the on/off state) of products/services provided via the meter, and/or components for measuring the volume or unit consumption of a product/service (e.g. a device for measuring time or flow of water).

Figure 25:
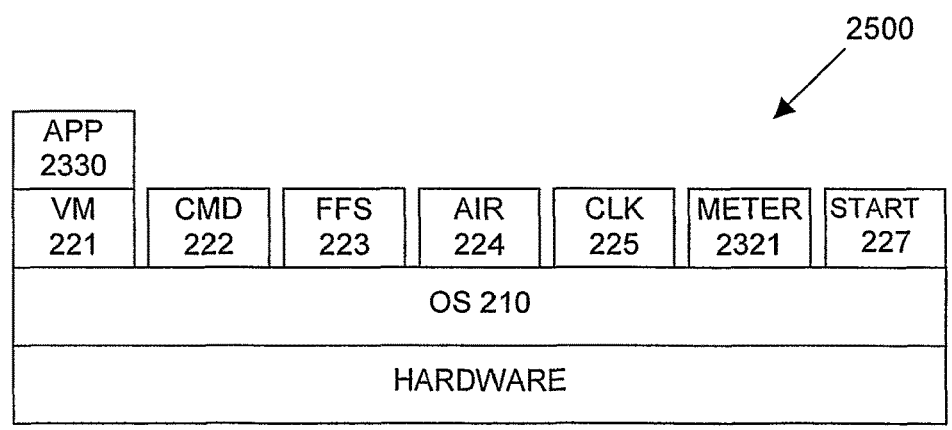
FIG. 25 is a block diagram of a logical architecture of a device for a metering application

The OS 210 of the client device 1002, as shown in FIG. 25, supports a number of tasks 221, 222, 223, 224, 225, 227, 2330 and 2321. The virtual machine (VM) 221 of the client device 1002 executes a meter application 2330 transmitted from the central server 1005 which monitors and/or controls one or more meters via the control interface 1016. The application 2330 operates the control interface 1016 to perform monitoring/control functions by sending instructions (via the VM 221) to the meter task 2321, which provides the software interface for the control interface 1016. The OS 210 also supports an air task 224, which enables the application 2330 to communicate with the central server 1005 (via the server transmission system) using the air protocol. Similarly, other tasks may be provided to enable the application 2330 to communicate with the central server 1005 or other devices (such as an RRU 1900 or another client processor device 100 utilised in an application such as a thermostat or dishwasher) using a different communications interface or communications protocol.

Figure 26:
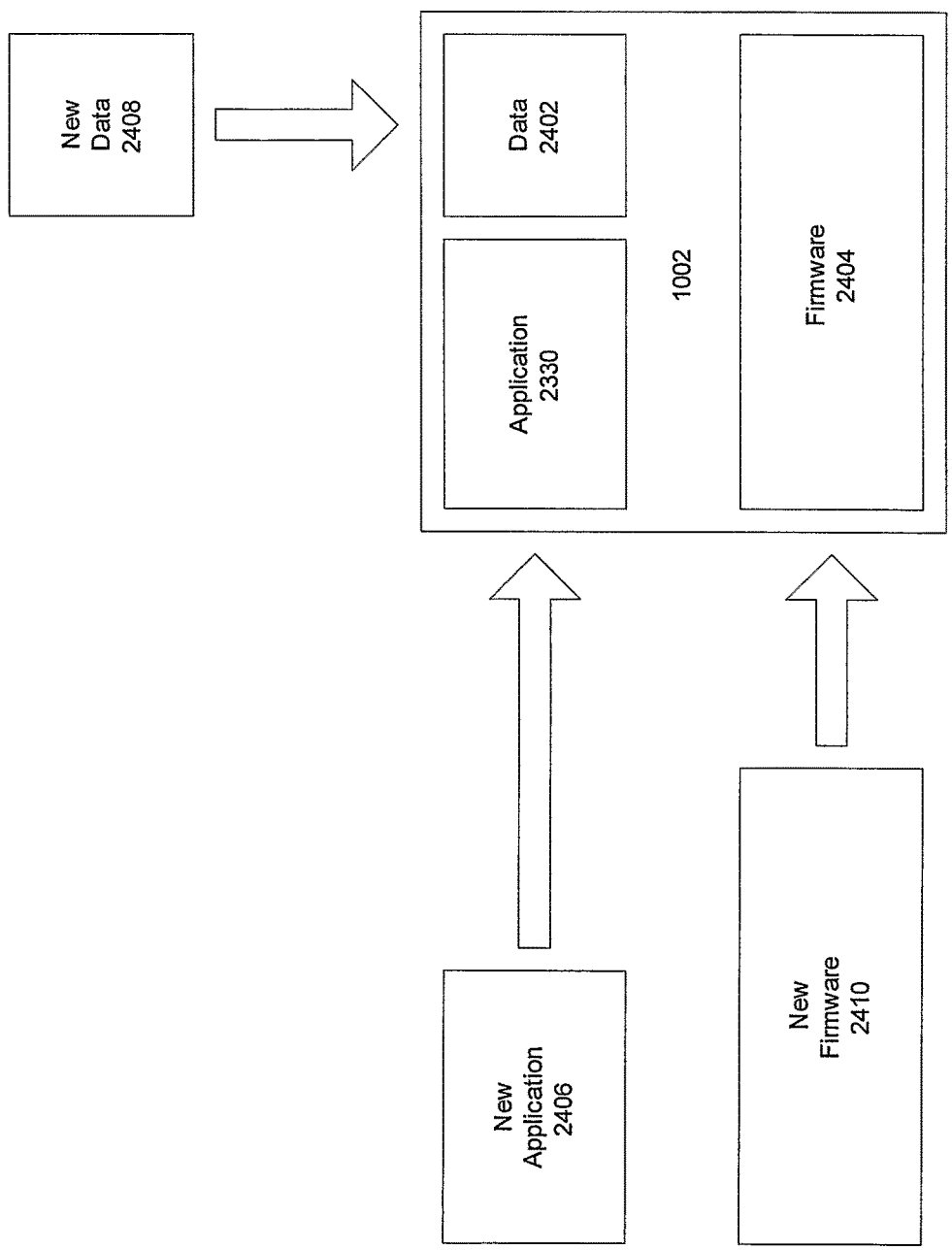
FIG. 26 is a block diagram of the upgrade of application, data and/or firmware of a client processor for a metering application

FIG. 26 is a block diagram showing the updating of different types of software components stored in the client device 1002. A client device 1002 stores various types of data required for the operation of the client device 1002. For example, the client device 1002 may contain firmware 2404 (e.g. stored in the ROM 106), one or more applications (e.g. 2330) and application data 2402. The application 2330 contains the logic for processing inputs received from the control interface 1016, and the application data 2402 defines the required operating parameters for the application 2330 to perform processing (e.g. the billing rate per unit consumption of a particular service). Application data 2402 may be specific for a particular application (e.g. 2330), or may be shared by different applications (e.g. for configuring global settings in the device 1002)

The firmware 2404, applications (e.g. 2330) and application data 2402 may each be replaced (in whole or in part) by files received from the central server 1005 via the server transmission system. The files received, as discussed previously, include configuration data, to designate files as including data for the new firmware 2410, data for new applications 2306, new application data 2408, or a combination of these.

When the device 1002 receives files from the server 1005 (e.g. as one or more file fragments), the data is processed in one of two ways. Firstly, the device 1002 stores the new firmware 2410, application(s) 2406 or application data 2408 derived from the files as a new version of the firmware 2404, application 2330 or application data 2402 (as described with reference to Table I)$_3$ and the init-tab file 621 is updated accordingly to reflect the new versions. Alternatively, the existing firmware 2404, application (e.g. 2330) or application data 2402 is removed from the device 1002, and replaced with the new firmware 2410, new application(s) 2406 or new application data 2408.

Processing of the files for updating the firmware 2404, applications (e.g. 2330) and application data 2402 stored in the device 1002 is achieved without interrupting the current operation of the device 1002. For example, if the device 1002 is processing input from the control interface 1016 at the time when a file fragment is received, the file fragment may be temporarily cached in the flash memory 120, and processed at the earliest opportunity after the device 1002 completes the current task. Alternatively, the device 1002 applies the files (i.e. saves the new firmware, application(s) and/or application data as a new version, and updates the init-tab file 621) concurrently with the other tasks being executed on the device 1002, and the new version of the firmware, application or application data is used the next time the device 1002 queries the init-tab file 621.

By storing multiple versions of the firmware 2404, application(s) (e.g. 2330) and/or application data 2402, the client device 1002 may automatically rollback to an older "working" version of the firmware 2404, application (e.g. 2330) or application data 2402 stored on the device 1002 (e.g. by querying the init-tab file 621). This is advantageous where the updates derived from the files received contain errors or other defects.

Figure 27:
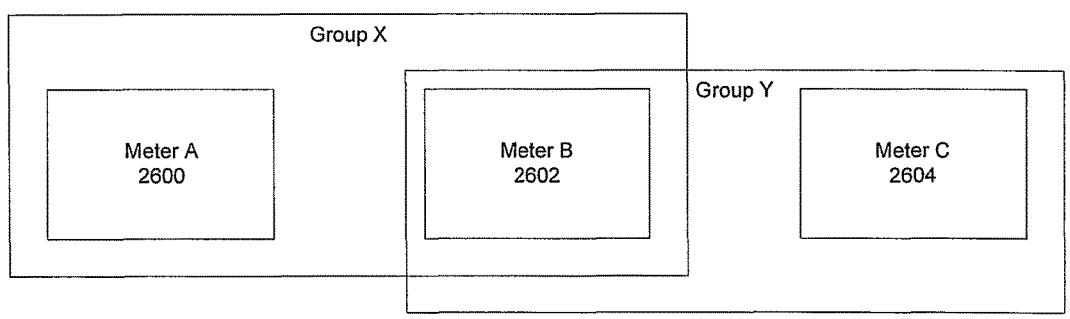
FIG. 27 is a block diagram of meter device grouping

FIG. 27 is a block diagram showing the logical organisation of a plurality of client devices 1002 into one or more groups. Each meter 2600, 2602 and 2604 is identified by a unique serial number, or in addition, by one or more group addresses. A group of meters may include one or more devices 1002, and each client device 1002 that belong to the same group stores the unique group address for that group. A device 1002 controls one or more respective meters. As shown in FIG. 27, group X includes meters 2600 and 2602, and the client devices 1002 for meters 2600 and 2602 will each store the group address for Group X. Similarly, the client devices 1002 for meters 2602 and 2604 will each store the group address for Group Y. A client device 1002 may belong to up to 8 different groups. Client devices 1002 may be grouped based on:

i) the function(s) performed by the meter controlled by that device 1002 (e.g. by defining a group for waters meters, a group for gas meters, and a group for electricity meters);
ii) the geographical location of the device 1002; and/or
iii) the physical configuration or components controlled by the device 1002 (e.g. meters which do not include a particular physical component, such as memory of a specific capacity, may be grouped together).

File fragments for a specific group of devices 1002 contains the group address for that group. Client devices 1002 will apply the file fragments if the device 1002 is associated with the group address specified in the fragments.

Client devices 1002 that receive the fragments but are not associated with the group address will ignore the fragments.

The metering system 1001 enables individual devices 1002 to be upgraded in a controlled manner. Different meters, each being controlled by a different client device 1002, may receive new file fragments at different times. For example, the server transmission system sends file fragments to one or more client devices 1002 as soon as the new data file fragments (e.g. for configuring the device 1002), becomes available for distribution. Alternatively, the server transmission system sends the new files to one or more client devices 1002 at a specific point in time (e.g. at a particular time of the day and/or date), or at predetermined time intervals (e.g. at the same time each day, or at the end of each month or quarter). The timing at which the new files are sent to each client device 1002 is determined by the settings corresponding to that device 1002 stored in the master database 1007. On receiving the new files, each client device 1002 may activate (i.e. apply) the new files immediately, or at a point in time specified in the files received (e.g. at a particular date and/or time).

Figure 28:
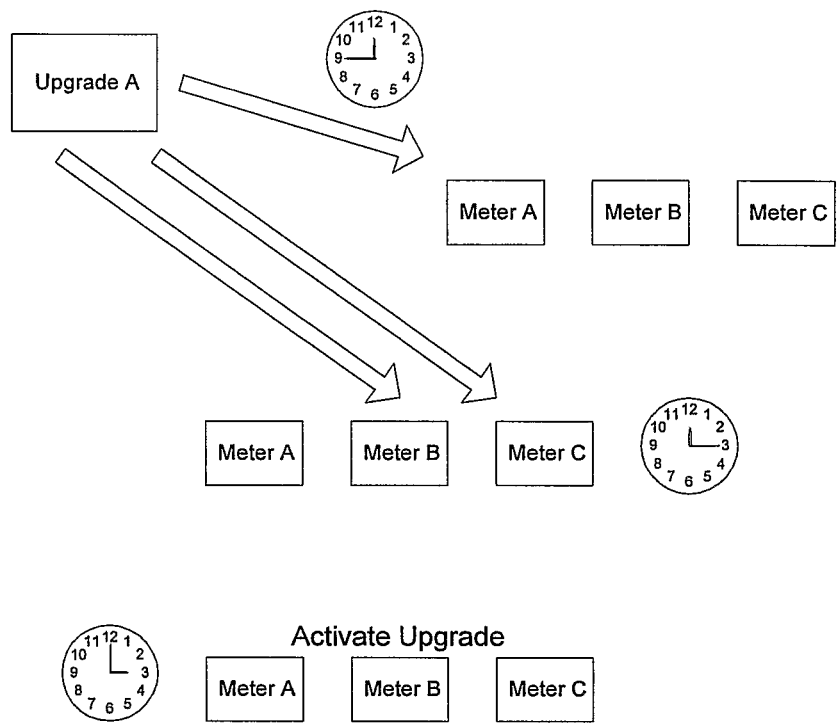
FIG. 28 is a block diagram of synchronous activation of multiple metering application upgrades

An example is described with reference to FIG. 28, which shows a block diagram of different meters being updated at different times. Files for Upgrade A are intended for meters A, B and C. However, the files for Upgrade A are sent to meter A at 9 o'clock in the morning, and the same is sent to meters B and C at 12:15 pm in the afternoon of the same day. Each meter (i.e. A, B or C) may immediately process the new files and apply the upgrade after receiving all the files. Alternatively, each meter (i.e. A, B and C) may cache the files (e.g. in memory 120) and apply it at a specific time. As shown in FIG. 28, the files specify that Upgrade A is to be applied by all meters A, B, and C at 3 o'clock on a particular date. Thus, meters A, B and C will apply the files at the time specified therein, regardless of how early the files were received by any particular meter (i.e. A, B or C).

The client device 1002 may detect changes to its physical configuration, and request (e.g. by sending a signal to the server 1005 that triggers the sending of new file fragments by return) any additional firmware 2410, application(s) 2406 or application data 2408, as required, for the device 1002 to operate under the new configuration. This applies, for example, if the physical configuration of the device 1002 has been upgraded with new internal components (such as memory 120), or when the device 1002 is required to control a new type of meter (e.g. upgrading or installing a new control interface 1016 to convert the interface 1016 from operating a water meter to a gas meter).

Figure 29:
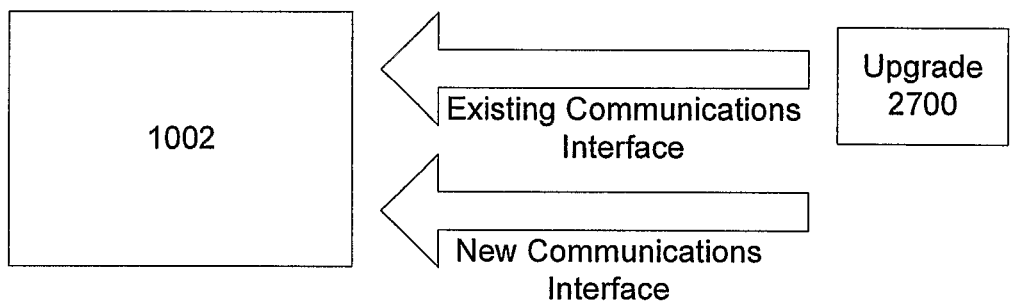
FIG. 29 is a flow diagram of implementation of a new communications interface and/or protocol to a client process for a metering application

FIG. 29 is a block diagram showing the implementation of a new communications interface on a client device 1002. The client device 1002 receives data 2700 (via the server transmission system) sent using an existing communications interface (e.g. the air protocol). The data 2700 includes changes to the firmware 2404, application 2330 and/or application data 2402 to enable the device 1002 to communicate using a new communications interface (e.g. an interface for the device 1002 to communicate on an Ethernet-based network in the TCP/IP protocol, assuming the device 1002 has the necessary hardware to do this). The data 2700 is applied, and the device 1002 is able to communicate via the new interface by using the new version of the firmware 2410, application 2406 or application data 2408 derived from the received data 2700.

Figure 30:
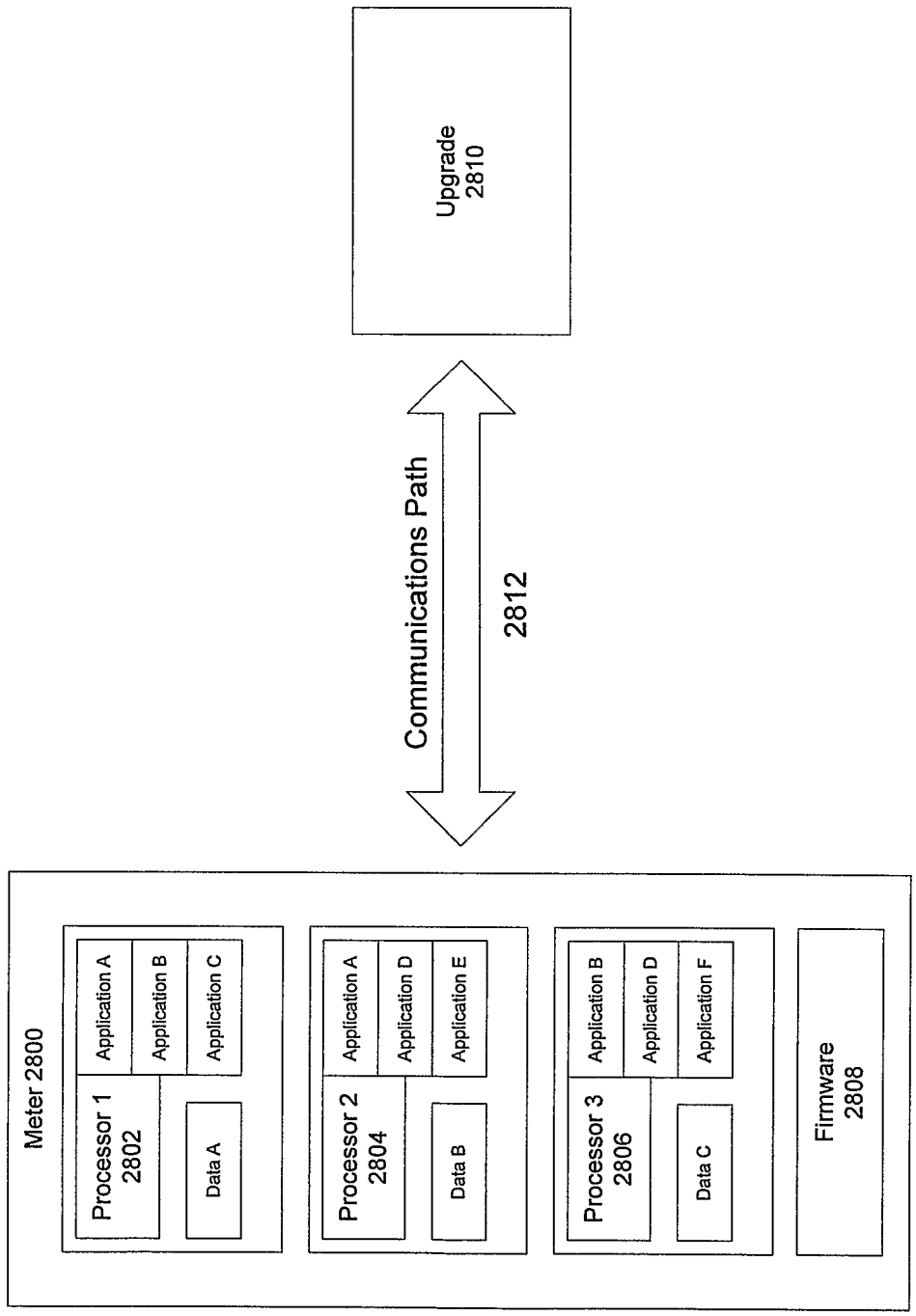
FIG. 30 is a block diagram of multitasking, multiple client processor structure capability

FIG. 30 is a block diagram of a meter 2800 controlled by a plurality of client devices 2802, 2804 and 2806. Each device 2802, 2804 and 2806 operates simultaneously and independently of each other, and is the same as the device 1002 shown in FIG. 24.

Although each device 2802, 2804 and 2806 has a single processor, a device 2802, 2804 and 2806 may include more than one processor. A meter 2800 having multiple client devices 2802, 2804 and 2806 is able to provide a broader range of functions, such as the combined metering of different types of services (e.g. water, gas and electricity). Each device 2802, 2804, 2806 may also separately and simultaneously monitor/control the consumption of the different services being metered.

As shown in FIG. 30, each device 2802, 2804 and 2806 may execute a number of different applications (e.g. shown as Applications A, B, C, D, E and F), and different devices 2802, 2804 and 2806 may execute the same application (e.g. device 2802 and 2804 both store and execute Application A). Furthermore, each device 2802, 2804 and 2806 may independently store and execute a separate set of firmware specific for that device, or alternatively, all the devices 2802, 2804 and 2806 may execute a common set of firmware 2808 stored in the meter 2800.

The meter 2800 receives configuration data 2810 for upgrading the firmware 2808, applications (e.g. Application A, B, C, D, E or F) and/or the application data (e.g. Data A, B, or C), for some or all of the devices 2802, 2804 and 2806. The configuration data 2810 is delivered to the devices 2802, 2804 and 2806 via a communications path 2812, and the path 2812 may include communications via one or more different communications interfaces (e.g. via a direct connection, wireless network or the Internet). Each device 2802, 2804 and 2806 applies the new configuration data 2810 in a way that does not interrupt the current operation of that device, as described above. Furthermore, the application of configuration data 2810 for a specific device (e.g. 2802) does not affect the operation of any other device (e.g. 2804 and 2806).

Figure 31:
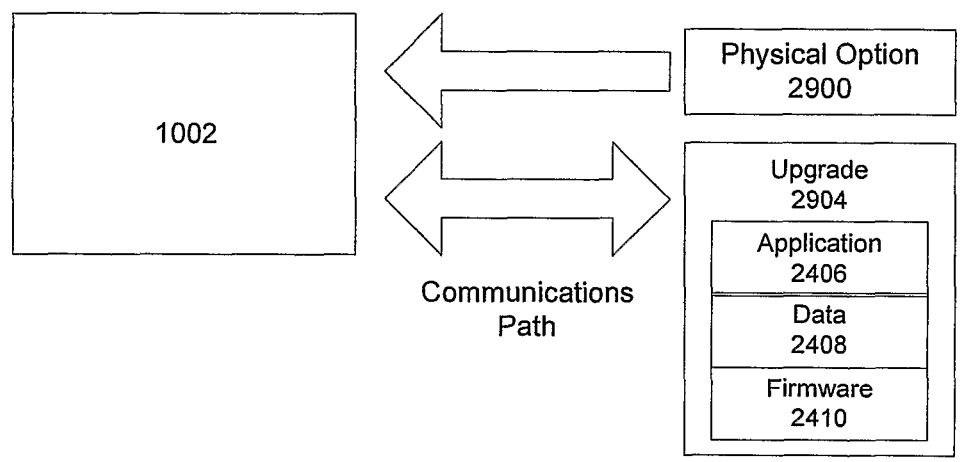
FIG. 31 is a block diagram of physical option implementation into a client processor

FIG. 31 is a block diagram of showing the client device 1002 receiving configuration data after a change in configuration. The client device 1002 may receive new memory components 120 for example to store more data. The client device 1002 detects the presence of the new physical component 2900 as a function of its firmware 2404 or application 2330, and the processor core 102 generates a request signal that is transmitted to the server 1005 (e.g. via a transmitter or communications adapter, such as an Ethernet adapter, communicating with the processor core 102 via the asynchronous serial interface 115). The request signal may specify the type of configuration change (e.g. whether the device 1002 has received upgraded memory, or a new control interface 1016). Based on the request signal, the server 1005 retrieves the required data from the master database 1007, and assembles the data (using the Update Manager 1006) for transmission to the client device via the server transmission system as configuration data 2904. The configuration data 2904 includes new firmware (e.g. 2410), new application files (e.g. 2406) and/or new application data (e.g. 2408). The configuration data 2904 is sent to the device 1002 via a communications path, which may involve transmission of data over one or more different communications interfaces (e.g. as described with reference to FIG. 17). The device 1002 applies the new configuration data 2904 once all the data 2904 has been received.

A client device 1002 may receive configuration broadcasted via the server transmission system via a uni-directional or bi-directional communications channel/interface. The client device 1002 may also communicate with other devices (e.g. a RRU 1900 or another client device 1002 such as a thermostat 3000 via a bi-directional communications channel/interface, or via a communications network.

FIG. 32 is a block diagram of a client device 1002 for monitoring/controlling a meter communicating with a second device 3000 (e.g. a RRU 1900 or another client device 1002). Both devices 1002 and 3000 may communicate with each other using a default communications protocol (e.g. IRDA or Bluetooth). The second device 3000 may have stored the necessary data (e.g. firmware, application files and/or application data) that enables the second device 3000 to communicate in an enhanced communications protocol (e.g. ZigBee). For example, the second device may have received the necessary data for communicating in the enhanced communications protocol from another device 3002, 3004 (e.g. another client device 1002 for controlling a meter), or from an external source (e.g. from the server 1005 via the server transmission system).

When the second device 3000 establishes a communications link with the client device 1002, the second device 3000 detects that the client device 1002 is unable to communicate in the enhanced communications protocol (e.g. based on the data transmitted between the devices 1002 and 3000 during establishment of the communications link). As a result, the second device 3000 transmits the necessary configuration data (e.g. firmware, application files and/or application data) to the client device 1002 to enable the client device 1002 to communicate in the enhanced communications protocol. The client device 1002 stores and applies the configuration data received from the second device 3000, and is then able to communicate with any other device (e.g. 3000) using the enhanced communications protocol. Similarly, the reverse scenario is possible, where the client device 1002 has the necessary data to enable it 1002 to communicate in an enhanced communications protocol, and transmitting configuration data to the second device 3000 to enable the second device 3000 to also communicate in the enhanced communications protocol. The client device 1002 may have received the necessary data for communicating in the enhanced communications protocol from another device 3002 (e.g. another client device 1002 for controlling a meter), or from an external source (e.g. from the server 1005 via the server transmission system).

The client device 1002 is able to control a meter and, in particular, adjust the charging tariffs or data recorded by the meter based on data the client device 1002 receives from other devices. For example, the meter can be adjusted when metering rates change or the rates or data retained by the meter can be adjusted based on readings obtained from a thermostat or a gas, power, or water consuming device, such as a dishwasher. This allows users to be penalised or rewarded dynamically for different levels of consumption, such as for setting thermostats at predetermined high or low levels for heating or air conditioning.

The client device 1002 allows the meter to continue metering while new rate files are downloaded.

Many modifications will be apparent to those skilled in the art without departing from the scope of the present invention as herein described with reference to the accompanying drawings.

What is claimed is:

1. A meter device including:
    a wireless communications receiver for receiving file fragments of files for the meter device and using a wireless communications protocol of an existing communications network infrastructure to receive the file fragments of the files, the file fragments for being included in payloads of packets of a meter communications protocol of the meter device;
    a microcontroller system for processing and identifying the file fragments for the meter device using the meter communications protocol of the meter device, storing the files composed of the file fragments, and performing an application defined by the stored files to reconfigure a meter of the meter device installed at a dwelling, wherein the application is performed automatically by the meter device without any user intervention or interaction with the meter device, wherein the wireless communications receiver is configured to receive the file fragments of the files prior to sending the file fragments of the files to the microcontroller system of the meter device.

2. The meter device of claim 1, wherein the meter device is remotely configured by a user accessing a server, such as a web server, and further comprising defining at least one of the application, a configuration, and data files to be sent to the meter device in the file fragments.

3. The meter device of claim 1, wherein the files include metering rate data for the meter.

4. The meter device of claim 3, wherein the meter of the meter device continues metering whilst a metering rate is adjusted based on the rate data.

5. The meter device of claim 3, wherein the meter device communicates with another device, such as a thermostat, and adjusts a metering rate of the meter of the meter device based on data obtained from the another device.

6. The meter device of claim 1, wherein the file fragments of the files are sent by a remote device to a plurality of meter devices including the meter device.

7. The meter device of claim 1, wherein the received file fragments for the meter device include an initial file defining remaining files of the received file fragments as being of a type of application, configuration or data, and defining reading of the files composed of the file fragments.

8. The meter device of claim 7, wherein the microcontroller system includes an operating system that includes a number of tasks to control basic processes performed by the microcontroller system and the number of tasks includes at least one of:
    (i) a clock task for implementing a real time clock and calendar;
    (ii) a virtual machine task for initiating a virtual machine, and causing reading of the initial file; and executing of a file;
    (iii) a command task for establishing device commands for production testing and initial configuration;
    (iv) a file system task for processing the file fragments of the files and removing unwanted and redundant files;
    (v) a communications interface task for controlling the receiver and processing data received by the receiver;
    (vi) an I/O task for processing of input and output signals for I/O peripherals, such as input buttons or display elements of the meter device;
    (vii) a GPS receiver task to control a GPS receiver of the meter device to generate location data;
    (viii) a voice task to control a voice processor of the meter device to generate audio announcements; and
    (ix) an I/O task for processing signals from other devices, such as a thermostat or dishwasher.

9. The meter device of claim 8, wherein the operating system includes a scheduler to allocate each task to be processed by the microcontroller system, and allocates semaphores to resources of the meter device to allow the microcontroller system to identify resources allocated to a running task.

10. The meter device of claim 9, wherein the file fragments are sent by a remote device to a plurality of the meter devices including the meter device.

11. The meter device of claim 1, wherein the wireless communications receiver is configured to receive the file fragments from a server transmission system configured for generating and transmitting the file fragments, the server transmission system further configured to provide a user interface allowing a user to submit instructions used to determine the application, a configuration of the meter device, and data files, to be sent to the meter device in the file fragments.

12. The meter device of claim 11, wherein the user interface of the server transmission system is further configured to allow the user to submit a meter identifier, wherein the server transmission system selects selecting the meter device based on the meter identifier.

13. The meter device of claim 12, wherein the file fragments are sent from the server transmission system to the meter device via a communications device, wherein the communications device receives the file fragments from the server transmission system prior to transmission of the file fragments from the communications device to the meter device.

* * * * *

UNITED STATES PATENT AND TRADEMARK OFFICE
CERTIFICATE OF CORRECTION

PATENT NO.         : 10,284,925 B2
APPLICATION NO.    : 15/631817
DATED              : May 7, 2019
INVENTOR(S)        : Andrew Paul Donaghey, Ian Kenneth Francis McDonald and David Lewis Beard It is certified that error appears in the above-identified patent and that said Letters Patent is hereby corrected as shown below:

In the Claims

Column 39, Line 5, Claim 10, after "plurality of" delete "the".

Column 39, Line 19, Claim 12, after "selects" delete "selecting".

Signed and Sealed this
Tenth Day of September, 2019

Andrei Iancu
*Director of the United States Patent and Trademark Office*